US010861932B2

(12) United States Patent
Chen et al.

(10) Patent No.: US 10,861,932 B2
(45) Date of Patent: Dec. 8, 2020

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventors: Ze Chen, Tokyo (JP); Kazuhiro Shimizu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/515,087

(22) Filed: Jul. 18, 2019

(65) Prior Publication Data

US 2020/0127082 A1 Apr. 23, 2020

(30) Foreign Application Priority Data

Oct. 23, 2018 (JP) ................................ 2018-198825

(51) Int. Cl.
*H01L 29/06* (2006.01)
*H01L 21/761* (2006.01)
*H01L 29/66* (2006.01)
*H01L 29/739* (2006.01)

(52) U.S. Cl.
CPC .......... *H01L 29/063* (2013.01); *H01L 21/761* (2013.01); *H01L 29/66348* (2013.01); *H01L 29/7397* (2013.01)

(58) Field of Classification Search
CPC . H01L 21/761; H01L 29/0619; H01L 29/063; H01L 29/0638; H01L 29/66348; H01L 29/7397
USPC ........................................................ 257/139
See application file for complete search history.

(56) References Cited

U.S. PATENT DOCUMENTS

| 9,349,811 B2 | 5/2016 | Takahashi |
| 9,508,792 B2 | 11/2016 | Kawakami et al. |
| 2011/0233714 A1* | 9/2011 | Lu ........................ H01L 29/1095 257/493 |
| 2013/0075819 A1* | 3/2013 | Takei .................. H01L 29/0619 257/355 |

FOREIGN PATENT DOCUMENTS

| JP | 5640969 B2 | 12/2014 |
| JP | 5784242 B2 | 9/2015 |

* cited by examiner

*Primary Examiner* — Long K Tran
(74) *Attorney, Agent, or Firm* — Studebaker & Brackett PC

(57) ABSTRACT

A semiconductor device includes a well region, a buffer region, an insulating film, an electrode, and an electric field relaxing structure. An impurity concentration in the buffer region is reduced in a direction away from the active region. An end portion of the electrode is located at a position closer to the active region than an end portion of the buffer region. The electric field relaxing structure includes a plurality of RESURF layers each surrounding the buffer region in a plan view and formed in a surface layer of the semiconductor substrate.

20 Claims, 18 Drawing Sheets

SEMICONDUCTOR DEVICE AND METHOD OF MANUFACTURING SEMICONDUCTOR DEVICE

BACKGROUND OF THE INVENTION

Field of the Invention

A technique disclosed in this specification relates to a semiconductor device and a method of manufacturing a semiconductor device.

Description of the Background Art

In the configuration of a semiconductor device conventionally suggested, electric field concentration is suppressed during application of a static breakdown voltage by providing a plurality of RESURF layers in a terminal part surrounding a cell part in a plan view corresponding to an active region in which an element structure is formed (Japanese Patent Publication No. 5784242 and Japanese Patent Publication No. 5640969, for example).

In such a configuration, however, an impurity implantation dose for forming a RESURF layer (hereinafter called a RESURF implantation dose) is required to be increased to a level near an upper limit of a permissible range for preventing reduction in a current value to cause element breakdown (hereinafter called Ic(break)). This unintentionally increases electric field near the outer edge of the terminal part. More specifically, in some cases, increasing a RESURF implantation dose makes a static breakdown voltage of a semiconductor device unstable.

As described above, the technique such as that shown in Japanese Patent Publication No. 5784242 or Japanese Patent Publication No. 5640969 fails to maintain the stability of a static breakdown voltage of a semiconductor device while preventing reduction in Ic(break).

SUMMARY

A technique disclosed in this specification is intended to provide a technique capable of maintaining the stability of a static breakdown voltage of a semiconductor device while preventing reduction in Ic(break).

A first aspect of the technique disclosed in this specification is a semiconductor device including: a semiconductor substrate of a first conductivity type; a well region of a second conductivity type surrounding an active region in a plan view and formed in a surface layer of the semiconductor substrate, the active region being a region in which an element structure is formed in the surface layer of the semiconductor substrate; a buffer region of the second conductivity type surrounding the well region in a plan view and formed in the surface layer of the semiconductor substrate; an insulating film formed on the upper surface of the well region and on the upper surface of the buffer region; an electrode formed on the upper surface of the insulating film; and an electric field relaxing structure of the second conductivity type surrounding the buffer region in a plan view and formed in the surface layer of the semiconductor substrate. The buffer region contacts the well region. An impurity concentration in the buffer region is reduced in a direction away from the active region. An end portion of the electrode away from the active region is located at a position closer to the active region than an end portion of the buffer region away from the active region. The electric field relaxing structure includes a plurality of RESURF layers of the second conductivity type each surrounding the buffer region in a plan view and formed in the surface layer of the semiconductor substrate. One of the RESURF layers closest to the active region contacts the buffer region. At least two of the RESURF layers in order of increasing distance from the active region contact each other.

A second aspect of the technique disclosed in this specification is a method of manufacturing a semiconductor device, including: forming a well region of a second conductivity type in a surface layer of a semiconductor substrate of a first conductivity type so as to surround an active region in a plan view, the active region being a region in which an element structure is formed in the surface layer of the semiconductor substrate; forming a buffer region of the second conductivity type in the surface layer of the semiconductor substrate so as to surround the well region in a plan view; forming an insulating film on the upper surface of the well region and on the upper surface of the buffer region; forming an electrode on the upper surface of the insulating film; and forming an electric field relaxing structure of the second conductivity type in the surface layer of the semiconductor substrate so as to surround the buffer region in a plan view. The buffer region contacts the well region. An impurity concentration in the buffer region is reduced in a direction away from the active region. An end portion of the electrode away from the active region is located at a position closer to the active region than an end portion of the buffer region away from the active region. The electric field relaxing structure includes a plurality of RESURF layers of the second conductivity type each surrounding the buffer region in a plan view and formed in the surface layer of the semiconductor substrate. One of the RESURF layers closest to the active region contacts the buffer region. At least two of the RESURF layers in order of increasing distance from the active region contact each other.

The first and second aspects of the technique disclosed in this specification make it possible to maintain the stability of a static breakdown voltage of the semiconductor device while preventing reduction in Ic(break).

These and other objects, features, aspects and advantages relating to a technique disclosed in this specification will become more apparent from the following detailed description when taken in conjunction with the accompanying drawings.

DESCRIPTION OF THE PREFERRED EMBODIMENTS

Figure 1:
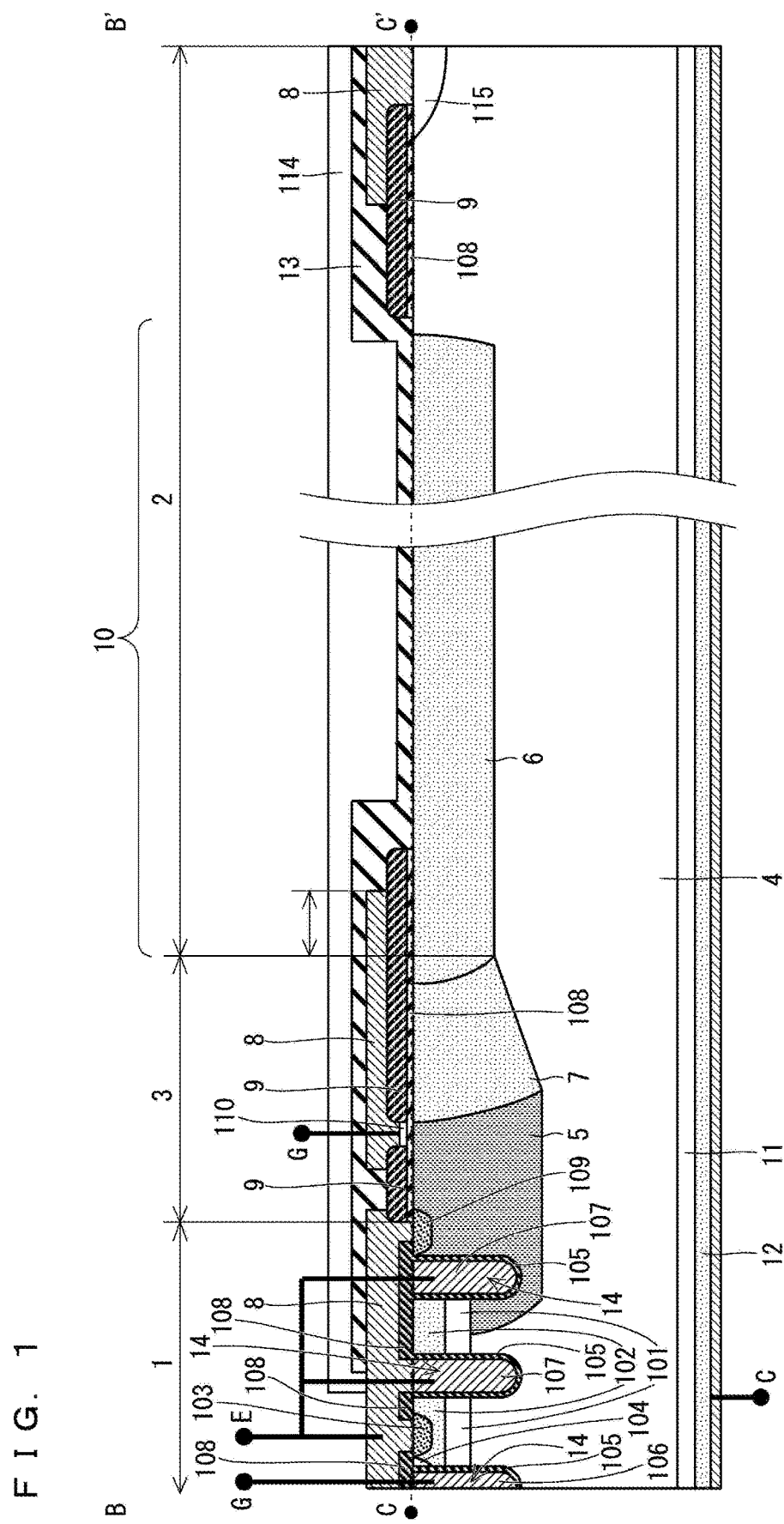
FIG. 1 is a sectional view showing an example of the configuration of an IGBT as a semiconductor device relating to a preferred embodiment.

Preferred embodiments will be described below by referring to the accompanying drawings. Exemplary effects produced by one, or two or more preferred embodiments will be described together after description of the one, or two or more preferred embodiments.

The drawings are presented schematically. For the convenience of illustration, a structure is omitted or simplified, where appropriate. Correlations in terms of size and position between structures, etc. shown in different drawings are not always illustrated correctly but are changeable, where appropriate. In a drawing such as a plan view except a sectional view, hatches may be given to facilitate understanding of the substances of the preferred embodiments.

In the description given below, similar components will be given the same sign and illustrated with the same sign in the drawings. These components will be given the same name and are to fulfill the same function. Thus, to avoid duplication, detailed description of these components will be omitted in some cases.

In the description given below, a term meaning a particular position or a particular direction such as "upper," "lower," "left," "right," "side," "bottom," "front," or "back" is used. These terms are used for the purpose of convenience to facilitate understanding of the substances of the preferred embodiments, and do not relate to directions in actual use.

In the description given below, an ordinal number such as "first" or "second" may be used. These terms are used for the purpose of convenience to facilitate understanding of the substances of the preferred embodiments, and are not intended to limit order that might be defined by these terms.

First Preferred Embodiment

A semiconductor device of a first preferred embodiment will be described below.

FIG. 1 is a sectional view showing an example of the configuration of an insulated gate bipolar transistor (namely, an IGBT) as a semiconductor device relating to this preferred embodiment. FIG. 1 is a sectional view taken along a line B-B' in FIG. 5 referred to below.

As illustrated in FIG. 1, the IGBT includes a cell part 1, an interface part 3 surrounding the cell part 1 in a plan view, and a terminal part 2 surrounding the interface part 3 in a plan view.

The cell part 1 includes: an N$^-$-type semiconductor substrate 4; an N-type semiconductor layer 11 formed on the lower surface of the N$^-$-type semiconductor substrate 4; a P-type collector layer 12 formed on the lower surface of the N-type semiconductor layer 11; a collector electrode connected to the lower surface of the P-type collector layer 12; an N-type diffusion layer 101 partially formed in a surface layer of the N$^-$-type semiconductor substrate 4; a P-type base layer 102 formed in a surface layer of the N-type diffusion layer 101; a P$^{++}$-type contact layer 103 partially formed in a surface layer of the P-type base layer 102; a plurality of trenches 14 penetrating the N$^-$-type semiconductor substrate 4 and the N-type diffusion layer 101 from the upper surface of the N$^-$-type semiconductor substrate 4; an N$^{++}$-type implantation layer 104 formed in the surface layer of the N$^-$-type semiconductor substrate 4 and between the trench 14 and the P$^{++}$-type contact layer 103; an insulating film 105 formed in the trench 14; a gate electrode 106 surrounded by the insulating film 105 in the trench 14 contacting the N$^{++}$-type implantation layer 104; an emitter electrode 107 surrounded by the insulating film 105 in the trench 14 without the gate electrode 106; an interlayer insulating film 108 formed on the upper surface of the N$^-$-type semiconductor substrate 4 while exposing a part of the emitter electrode 107 and the P$^{++}$-type contact layer 103; an electrode 8 covering a part of the emitter electrode 107, the P$^{++}$-type contact layer 103, and the interlayer insulating film 108; a semi-insulating film 13 having hopping conductivity partially covering the electrode 8; and a protective film 114 covering the semi-insulating film 13 and a part of the electrode 8.

The interface part 3 includes: the N$^-$-type semiconductor substrate 4; the N-type semiconductor layer 11; the P-type collector layer 12; a P$^+$-type well region 5 as a P-type impurity layer partially formed in the surface layer of the N$^-$-type semiconductor substrate 4; a P$^{++}$-type contact layer 109 formed in the surface layer of the P$^+$-type well region 5 and connected to the electrode 8 in the cell part 1; a P-type buffer region 7 partially formed in the surface layer of the N⁻-type semiconductor substrate 4, extending continuously from the P⁺-type well region 5, and formed at a closer position to the terminal part 2 than the P⁺-type well region 5; the interlayer insulating film 108 formed on the upper surface of the N⁻-type semiconductor substrate 4; an oxide film 9 partially formed on the upper surface of the interlayer insulating film 108; a surface polysilicon gate line 110 formed on a part of the upper surface of the interlayer insulating film 108 exposed without being covered by the oxide film 9; the electrode 8 covering the surface polysilicon gate line 110 and a part of the oxide film 9; the semi-insulating film 13 covering the electrode 8 and the oxide film 9; and the protective film 114 covering the semi-insulating film 13.

The terminal part 2 includes: the N⁻-type semiconductor substrate 4; the N-type semiconductor layer 11; the P-type collector layer 12; a P⁻-type RESURF layer 6 as a P-type impurity layer extending continuously from the P-type buffer region 7 and partially formed in the surface layer of the N⁻-type semiconductor substrate 4; an N⁺⁺-type stopper layer 115 formed in the surface layer of the N⁻-type semiconductor substrate 4 at the outer edge of the N⁻-type semiconductor substrate 4; the interlayer insulating film 108 partially formed on the upper surface of the N⁻-type semiconductor substrate 4; the oxide film 9 partially formed on the upper surface of the interlayer insulating film 108; the electrode 8 covering the N⁺⁺-type stopper layer 115 and a part of the oxide film 9; the semi-insulating film 13 covering the upper surface of the N⁻-type semiconductor substrate 4 in the presence of the electrode 8 and the oxide film 9; and the protective film 114 covering the semi-insulating film 13. The electrode 8 is formed to extend across the interface part 3 and the terminal part 2.

A region in the presence of the P⁻-type RESURF layer 6 corresponds to an electric field relaxing structure 10. The electrode 8 formed in the terminal part 2 and extending continuously from the electrode 8 in the interface part 3 has an external end portion (namely, an end portion closer to the terminal part 2) located external to an end portion of the P⁻-type RESURF layer 6 continuous with the P-type buffer region 7.

The terminal part 2 is covered by the semi-insulating film 13 at the same potential as the emitter electrode. This achieves screening of electrical influence on the interior of the substrate to be caused by external charge.

Figure 2:
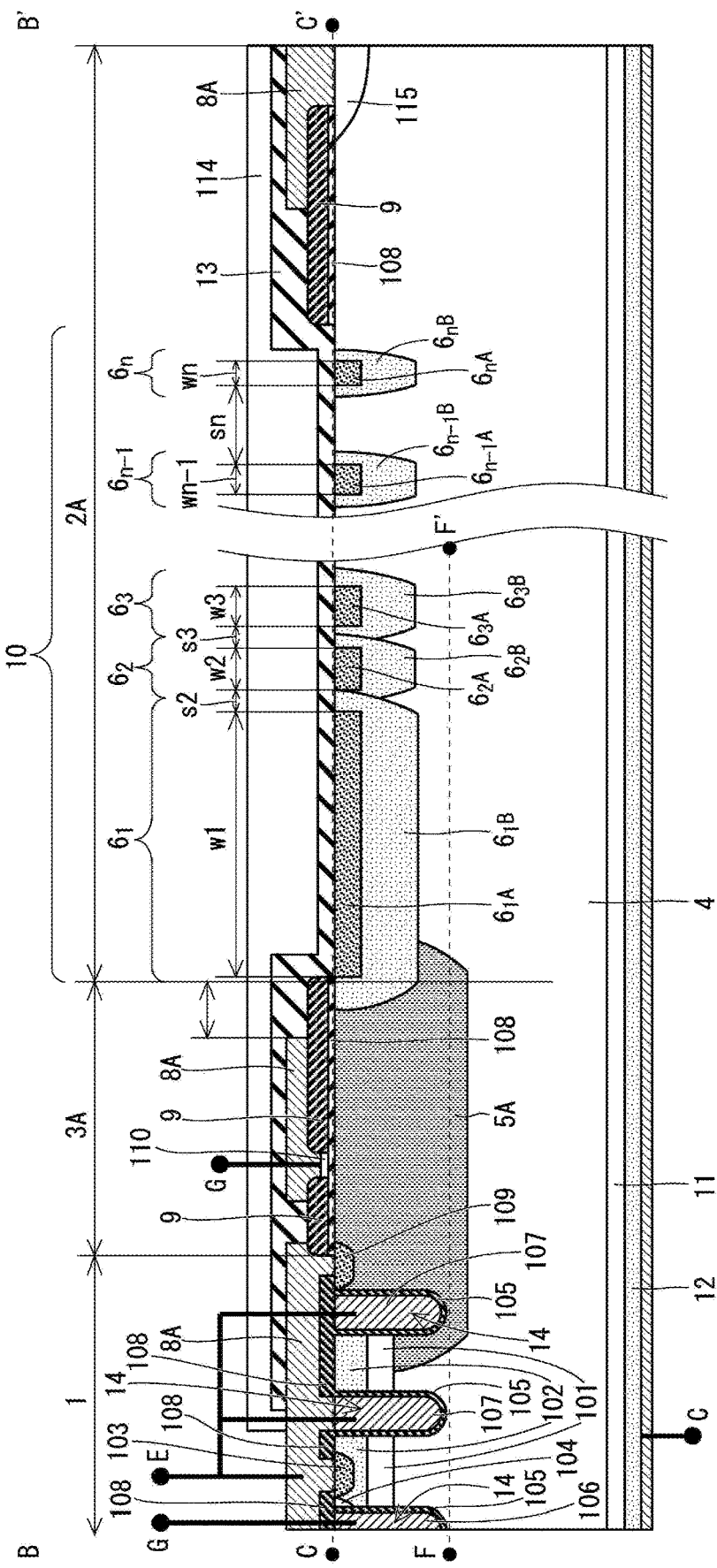
FIG. 2 is a sectional view showing a different example of the configuration of an IGBT as a semiconductor device relating to the preferred embodiment.

FIG. 2 is a sectional view showing a different example of the configuration of an IGBT as a semiconductor device. As illustrated in FIG. 2, the IGBT includes the cell part 1, an interface part 3A surrounding the cell part 1 in a plan view, and a terminal part 2A surrounding the interface part 3A in a plan view.

The cell part 1 includes: the N⁻-type semiconductor substrate 4; the N-type semiconductor layer 11; the P-type collector layer 12; the collector electrode; the N-type diffusion layer 101; the P-type base layer 102; the P⁺⁺-type contact layer 103; a plurality of trenches 14; the N⁺⁺-type implantation layer 104; the insulating film 105; the gate electrode 106; the emitter electrode 107; the interlayer insulating film 108; an electrode 8A; the semi-insulating film 13; and the protective film 114.

The interface part 3A includes: the N⁻-type semiconductor substrate 4; the N-type semiconductor layer 11; the P-type collector layer 12; a P⁺-type well region 5A as a P-type impurity layer formed in the surface layer of the N⁻-type semiconductor substrate 4; the P⁺⁺-type contact layer 109 formed in a surface layer of the P⁺-type well region 5A and connected to the electrode 8A in the cell part 1; the interlayer insulating film 108; the oxide film 9; the surface polysilicon gate line 110; the electrode 8A covering a part of the emitter electrode 107, the P⁺⁺-type contact layer 103, and the interlayer insulating film 108; the semi-insulating film 13; and the protective film 114.

The terminal part 2A includes: the N⁻-type semiconductor substrate 4; the N-type semiconductor layer 11; the P-type collector layer 12; a P⁻-type diffusion layer $6_1$B as a P-type impurity layer extending continuously from the P⁺-type well region 5A and partially formed in the surface layer of the N⁻-type semiconductor substrate 4; a P-type implantation layer $6_1$A as a P-type impurity layer partially formed in a surface layer of the P⁻-type diffusion layer $6_1$B; a P⁻-type diffusion layer $6_2$B as a P-type impurity layer extending continuously from the P⁻-type diffusion layer $6_1$B, partially formed in the surface layer of the N⁻-type semiconductor substrate 4, and located external to the P⁻-type diffusion layer $6_1$B; a P-type implantation layer $6_2$A as a P-type impurity layer partially formed in a surface layer of the P⁻-type diffusion layer $6_2$B; a P⁻-type diffusion layer $6_3$B as a P-type impurity layer extending continuously from the P⁻-type diffusion layer $6_2$B, partially formed in the surface layer of the N⁻-type semiconductor substrate 4, and located external to the P⁻-type diffusion layer $6_2$B; a P-type implantation layer $6_3$A as a P-type impurity layer partially formed in a surface layer of the P⁻-type diffusion layer $6_3$B; a P⁻-type diffusion layer $6_n$B as a P-type impurity layer located external to a P⁻-type diffusion layer $6_{n-1}$B; a P-type implantation layer $6_n$A as a P-type impurity layer partially formed in a surface layer of the P⁻-type diffusion layer $6_n$B; the N⁺⁺-type stopper layer 115; the interlayer insulating film 108; the oxide film 9; the semi-insulating film 13; and the protective film 114.

Of the foregoing elements, the P⁻-type diffusion layer $6_1$B, the P-type implantation layer $6_1$A, the P⁻-type diffusion layer $6_2$B, the P-type implantation layer $6_2$A, the P⁻-type diffusion layer $6_3$B, the P-type implantation layer $6_3$A, . . . , the P⁻-type diffusion layer $6_{n-1}$B, the P-type implantation layer $6_{n-1}$A, the P⁻-type diffusion layer $6_n$B, and the P-type implantation layer $6_n$A form the electric field relaxing structure 10.

The P⁻-type diffusion layer $6_1$B and the P-type implantation layer $6_1$A form a P-type RESURF layer $6_1$. Likewise, the P⁻-type diffusion layer $6_2$B and the P-type implantation layer $6_2$A form a P-type RESURF layer $6_2$. The P⁻-type diffusion layer $6_3$B and the P-type implantation layer $6_3$A form a P-type RESURF layer $6_3$. The P⁻-type diffusion layer $6_{n-1}$B and the P-type implantation layer $6_{n-1}$A form a P-type RESURF layer $6_{n-1}$. The P⁻-type diffusion layer $6_n$B and the P-type implantation layer $6_n$A form a P-type RESURF layer $6_n$.

The width of the P-type implantation layer $6_1$A is defined as w1. The width of the P-type implantation layer $6_2$A is defined as w2. The width of the P-type implantation layer $6_3$A is defined as w3. Likewise, the width of the P-type implantation layer $6_{n-1}$A is defined as w(n−1), and the width of the P-type implantation layer $6_n$A is defined as wn.

A region between the P-type implantation layer $6_1$A and the P-type implantation layer $6_2$A is defined as an interlayer region (of a width of s2). A region between the P-type implantation layer $6_2$A and the P-type implantation layer $6_3$A is defined as an interlayer region (of a width of s3). Likewise, a region between the P-type implantation layer $6_{n-1}$A and the P-type implantation layer $6_n$A is defined as an interlayer region (of a width of sn).

The width s2 of the interlayer region and the width w2 of the P-type implantation layer $6_2$A contacting an end portion of this interlayer region in a direction away from the cell part 1 form one set. Further, the width s3 of the interlayer region and the width w3 of the P-type implantation layer $6_3A$ contacting an end portion of this interlayer region in the direction away from the cell part 1 form one set. Likewise, the width sn of the interlayer region and the width wn of the P-type implantation layer $6_nA$ contacting an end portion of this interlayer region in the direction away from the cell part 1 form one set.

In the configuration illustrated in FIG. 2, the electric field relaxing structure 10 includes a plurality of RESURF layers. This results in a relatively wide process margin (permissible range) for a RESURF implantation dose relative to a static breakdown voltage (hereinafter called a breakdown voltage (BV)), as will be described later.

In the foregoing configuration, by appropriately designing the width w2, w3 . . . wn, the width s2, s3 . . . sn of the interlayer region, and the number of a set including the interlayer region and the P-type implantation layer corresponding to this interlayer region, an electric field distribution in the substrate in the electric field relaxing structure 10 can become an ideal distribution of a shape like a trapezoid in which an electric field intensity is low in places toward the cell part and the terminal part and is high in the vicinity of an intermediate position between the cell part and the terminal part.

This makes it possible to form a semiconductor element structure to achieve an intended static breakdown voltage in response to a breakdown voltage class (such as a high breakdown voltage class of 3300 V, for example) at which each semiconductor device is to be used and an application of the semiconductor device.

In one assumed configuration, a RESURF implantation dose has dependence on a static breakdown voltage of a semiconductor element structure. If a RESURF implantation dose becomes higher than an upper limit of a permissible range, an electric field in the substrate in the electric field relaxing structure 10 during application of a static breakdown voltage concentrates on a place toward the terminal part. This leads to reduction in BV.

Meanwhile, if a RESURF implantation dose becomes less than a lower limit of the permissible range, an electric field in the substrate in the electric field relaxing structure 10 during application of the static breakdown voltage concentrates on a place toward the cell part. This also leads to reduction in BV.

As understood from above, a process margin (permissible range) for a RESURF implantation dose is determined in terms of preventing reduction in BV.

When a semiconductor element is switched from an ON state to an OFF state (namely, during turn-off shutdown operation), conductivity modulation occurs to make the concentration of carriers accumulated in the N$^-$-type semiconductor substrate 4 higher than an impurity concentration in the N$^-$-type semiconductor substrate 4. This prohibits formation of depletion in the substrate.

This causes an electric field in the substrate in the electric field relaxing structure 10 during application of a static breakdown voltage to concentrate on a place toward the cell part to cause electric field concentration on an end portion of the P$^+$-type well region 5A toward the terminal part, leading to current breakdown.

Figure 3:
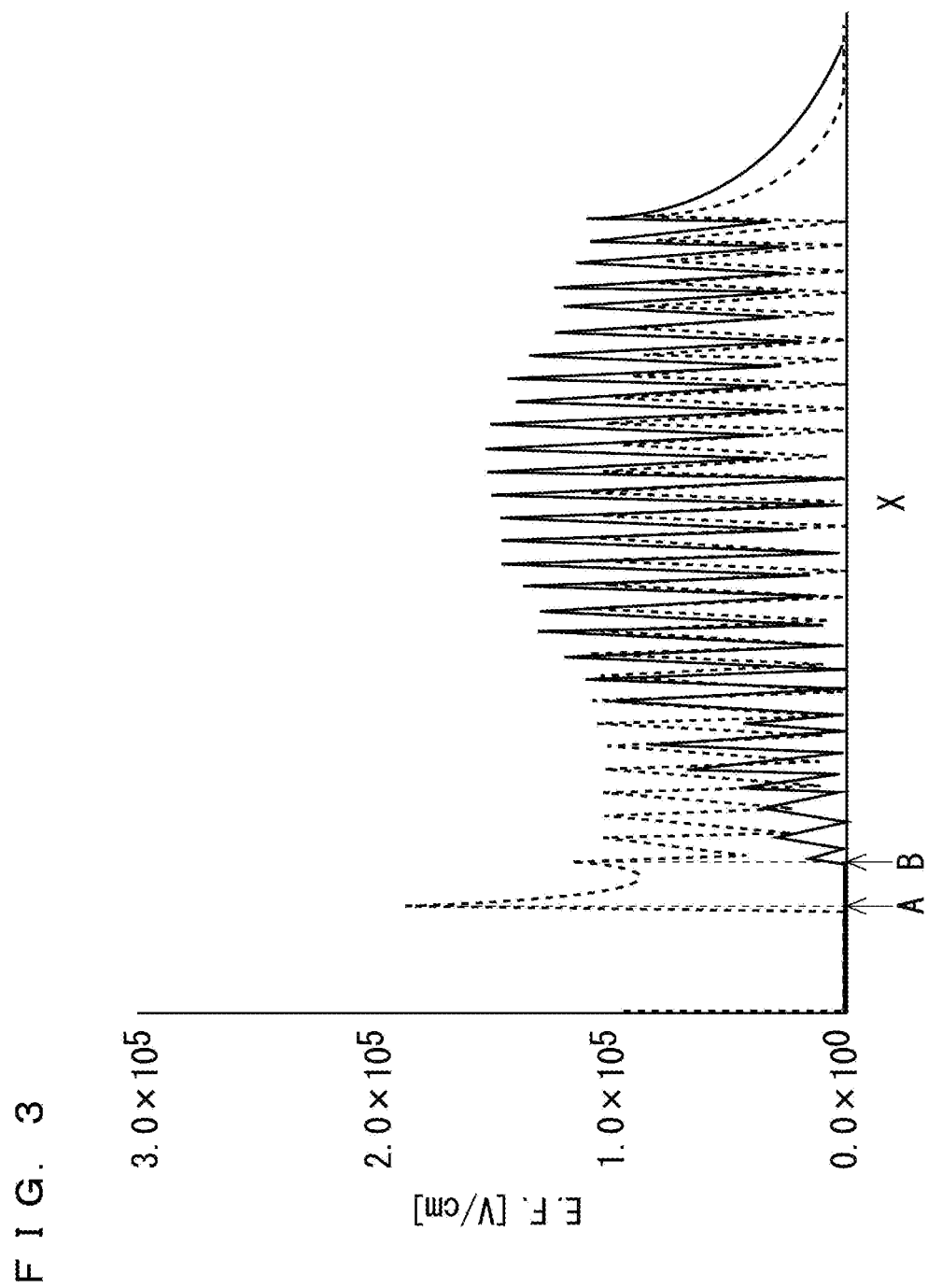
FIG. 3 is a view for comparing an electric field distribution during application of a static breakdown voltage and an electric field distribution during turn-off shutdown operation in the configuration shown in FIG. 2 with a constant RESURF implantation dose.

FIG. 3 is a view for comparing an electric field distribution during application of a static breakdown voltage and an electric field distribution during turn-off shutdown operation in the configuration shown in FIG. 2 with a constant RESURF implantation dose. In FIG. 3, the vertical axis shows an electric field distribution [V/cm] along a section C-C' in FIG. 2, and the horizontal axis shows a position on a coordinate from the cell part toward the terminal part.

A point A in FIG. 3 corresponds to an end portion of the P$^+$-type well region toward the terminal part in the configuration shown in FIG. 2. A point B in FIG. 3 corresponds to an end portion of the P$^-$-type diffusion layer $6_1B$ toward the terminal part in the configuration shown in FIG. 2. In FIG. 3, dotted lines indicate the electric field distribution during turn-off shutdown operation, and solid lines indicate the electric field distribution during application of a static breakdown voltage. Further, an equal voltage is applied for making the comparison.

As illustrated in FIG. 3, an ideal electric field distribution is formed during application of a static breakdown voltage. By contrast, during turn-off shutdown operation, an electric field concentrates on the end portion of the P$^+$-type well region 5 toward the terminal part, leading to reduction in Ic(break).

As a result, a lower limit of a RESURF implantation dose is determined not from the viewpoint of BV but from the viewpoint of Ic(break) to narrow a process margin (permissible range) for the RESURF implantation dose.

In the configuration shown in FIG. 1, the RESURF layer 6 forms the electric field relaxing structure 10. Like in this case, in the presence of one RESURF layer, an electric field in the substrate concentrates on an end portion of the RESURF layer 6 toward the cell part and contacting the P$^+$-type well region 5 and on an end portion of the RESURF layer 6 toward the terminal part.

If a RESURF implantation dose exceeds an upper limit or a lower limit of the permissible range (namely, if the RESURF implantation dose exceeds the upper limit or falls below the lower limit), an electric field further concentrates on both the end portion of the RESURF layer 6 toward the cell part and the end portion of the RESURF layer 6 toward the terminal part. Hence, the process margin for the RESURF implantation dose in the configuration shown in FIG. 1 becomes narrower than the process margin for RESURF implantation dose in the configuration shown in FIG. 2.

To suppress electric field concentration on a place toward the cell part in the configuration shown in FIG. 1, the electrode 8 is formed to be located external to an end portion of the P-type buffer region 7 toward the terminal part.

This makes it possible to suppress an electric field during application of a static breakdown voltage using a field plate effect of the electrode 8.

During turn-off shutdown operation, however, formation of depletion in the substrate is prohibited as described above to cause electric field concentration on a place directly below the field plate end portion of the electrode 8. This causes current breakdown of the device.

As understood above, it is not desirable to extend the electrode 8 so as to make an end portion thereof reach the electric field relaxing structure 10 in the terminal part 2.

Figure 4:
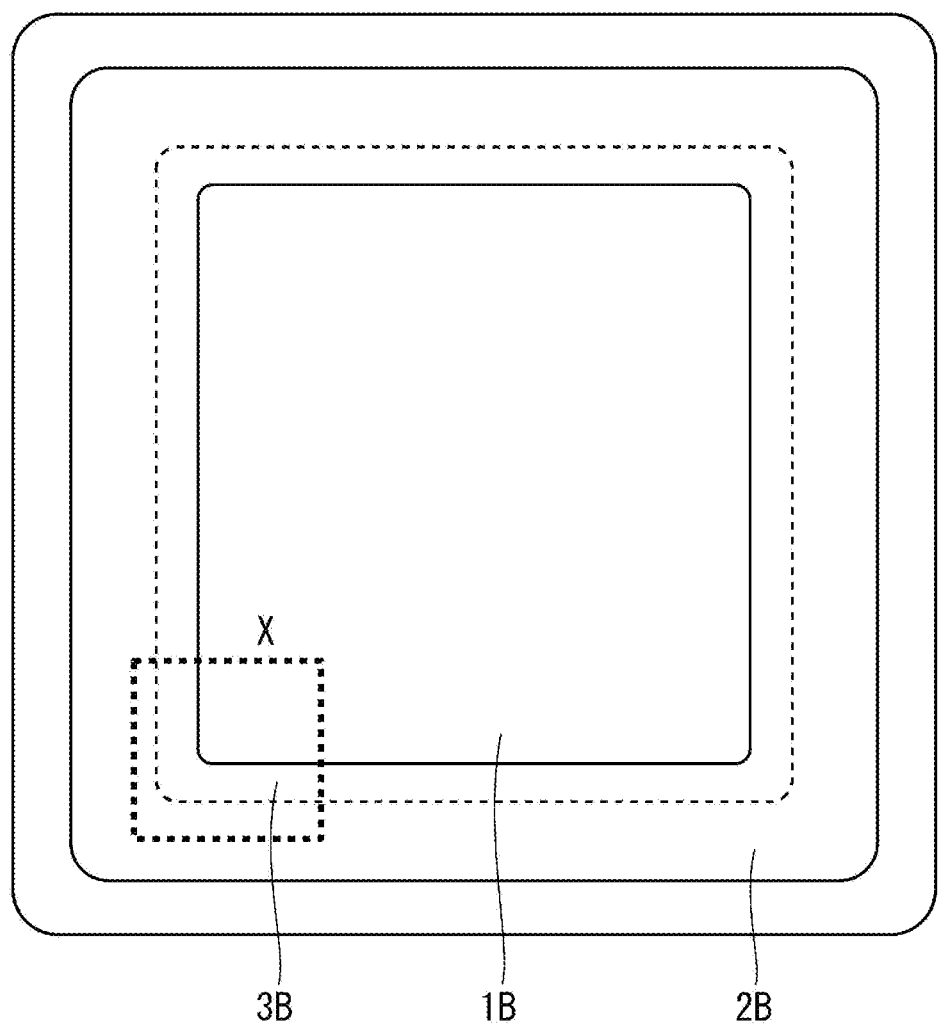
FIG. 4 is a plan view showing an example of the configuration of the semiconductor device of the preferred embodiment.

FIG. 4 is a plan view showing an example of the configuration of the semiconductor device of the preferred embodiment. As illustrated in FIG. 4, the semiconductor device of this preferred embodiment includes a cell part 1B, an interface part 3B surrounding the cell part 1B in a plan view, and a terminal part 2B surrounding the interface part 3B in a plan view.

Figure 5:
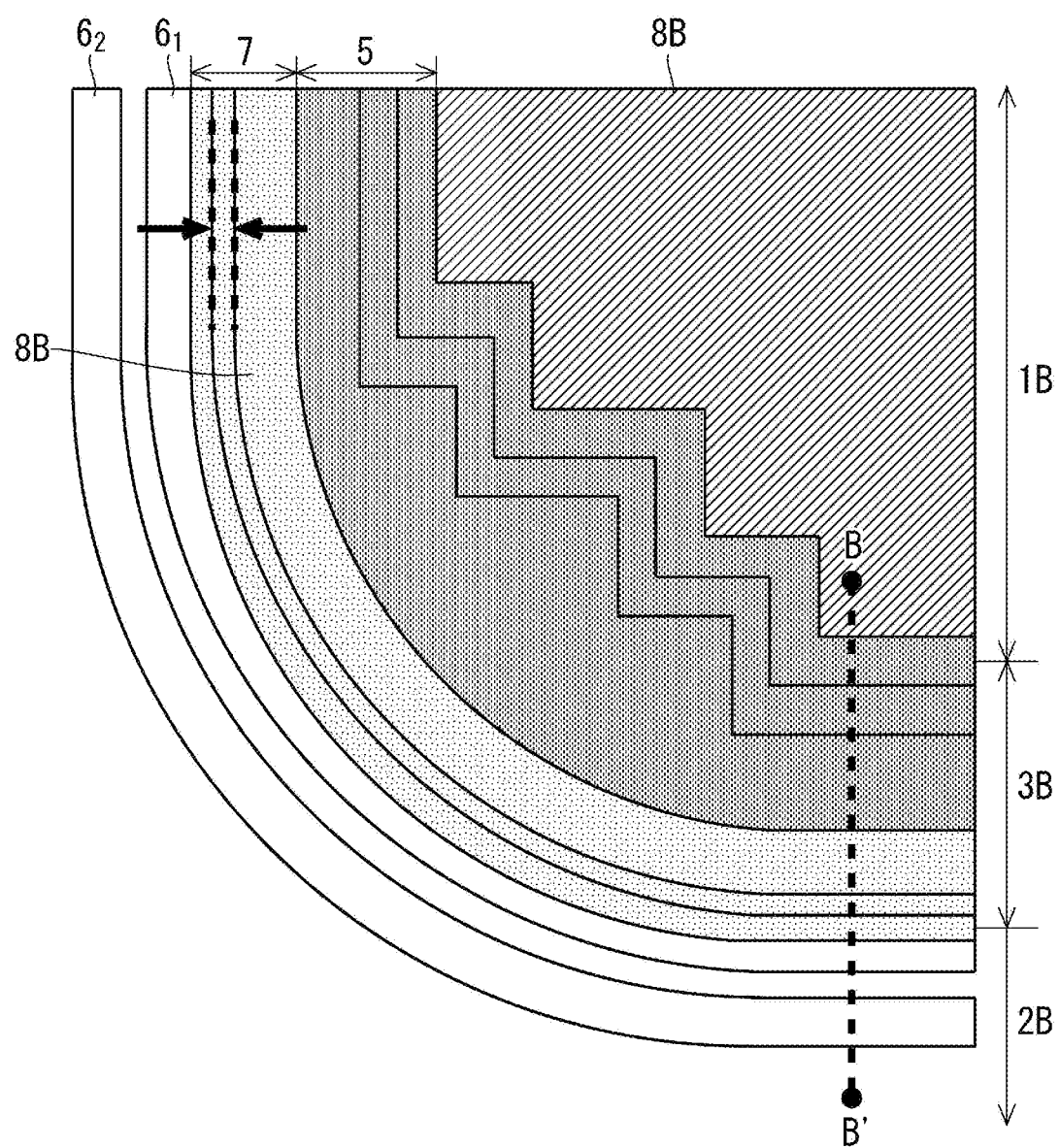
FIG. 5 is a plan view showing a region X in FIG. 4 in an enlarged manner.

FIG. 5 is a plan view showing a region X in FIG. 4 in an enlarged manner. As illustrated in FIG. 5, the semiconductor device of this preferred embodiment includes the cell part 1B, the interface part 3B surrounding the cell part 1B in a plan view, and the terminal part 2B surrounding the interface part 3B in a plan view in the region X.

In FIG. 5, the cell part 1B includes the P$^+$-type well region 5 formed at the outer edge of the cell part 1B, and an electrode 8B covering the P$^+$-type well region 5 and made of aluminum, for example.

The interface part 3B includes the P$^+$-type well region 5, the P-type buffer region 7 continuous with the outer edge of the P$^+$-type well region 5, and the electrode 8B covering the P$^+$-type well region 5 and a part of the P-type buffer region 7.

As shown in FIG. 5, the outer edge of the electrode 8B is separated from the P-type RESURF layer $6_1$ forming an electric field relaxing structure.

The terminal part 2B at least includes the P-type RESURF layer $6_1$ surrounding the P-type buffer region 7 in a plan view, and the P-type RESURF layer $6_2$ surrounding the P-type RESURF layer $6_1$ in a plan view.

Figure 6:
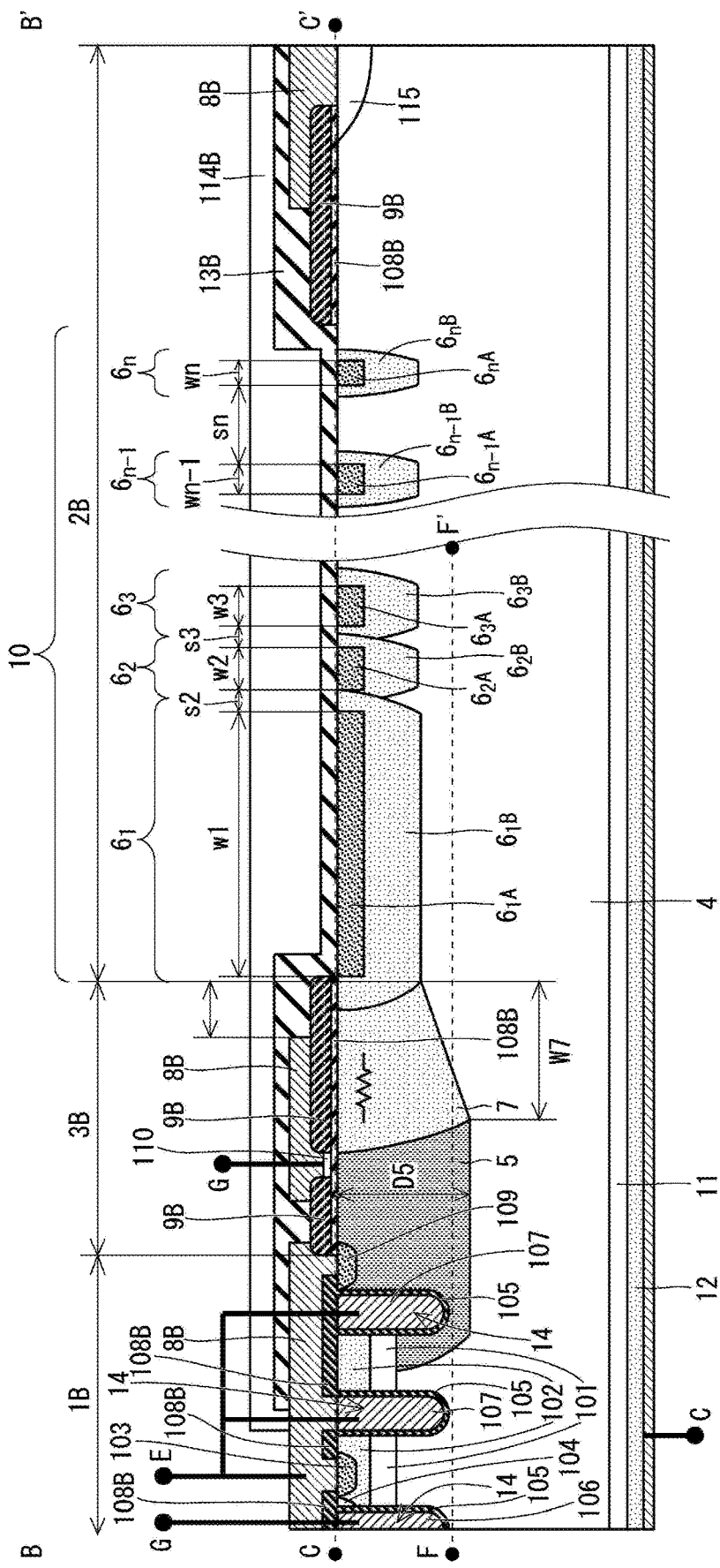
FIG. 6 is a sectional view taken along a line B-B' in FIG. 5.

FIG. 6 is a sectional view taken along the line B-B' in FIG. 5. As illustrated in FIG. 6, the semiconductor device of this preferred embodiment includes the cell part 1B, the interface part 3B surrounding the cell part 1B in a plan view, and the terminal part 2B surrounding the interface part 3B in a plan view.

The cell part 1B includes: the N$^-$-type semiconductor substrate 4; the N-type semiconductor layer 11; the P-type collector layer 12; the collector electrode; the N-type diffusion layer 101; the P-type base layer 102; the P$^{++}$-type contact layer 103; a plurality of trenches 14; the N$^{++}$-type implantation layer 104; the insulating film 105; the gate electrode 106; the emitter electrode 107; an interlayer insulating film 108B formed on the upper surface of the N$^-$-type semiconductor substrate 4 while exposing a part of the emitter electrode 107 and the P$^{++}$-type contact layer 103; the electrode 8B covering a part of the emitter electrode 107, the P$^{++}$-type contact layer 103, and the interlayer insulating film 108B; a semi-insulating film 13B having hopping conductivity partially covering the electrode 8B; and a protective film 114B covering the semi-insulating film 13B and a part of the electrode 8B.

The interface part 3B includes: the N$^-$-type semiconductor substrate 4; the N-type semiconductor layer 11; the P-type collector layer 12; the P$^+$-type well region 5; the P$^{++}$-type contact layer 109 formed in the surface layer of the P$^+$-type well region 5 and connected to the electrode 8B in the cell part 1B; the P-type buffer region 7; the interlayer insulating film 108B formed on the upper surface of the N$^-$-type semiconductor substrate 4; an oxide film 9B partially formed on the upper surface of the interlayer insulating film 108B; the surface polysilicon gate line 110; the electrode 8B covering the surface polysilicon gate line 110 and a part of the oxide film 9B; the semi-insulating film 13B covering the electrode 8B and the oxide film 9B; and the protective film 114B covering the semi-insulating film 13B.

The terminal part 2B includes: the N$^-$-type semiconductor substrate 4; the N-type semiconductor layer 11; the P-type collector layer 12; the P$^-$-type diffusion layer $6_1$B as a P-type impurity layer extending continuously from the P-type buffer region 7 and partially formed in the surface layer of the N$^-$-type semiconductor substrate 4; the P-type implantation layer $6_1$A; the P$^-$-type diffusion layer $6_2$B; the P-type implantation layer $6_2$A; the P$^-$-type diffusion layer $6_3$B; the P-type implantation layer $6_3$A; the P$^-$-type diffusion layer $6_n$B; the P-type implantation layer $6_n$A; the N$^{++}$-type stopper layer 115; the interlayer insulating film 108B partially formed on the upper surface of the N$^-$-type semiconductor substrate 4; the oxide film 9B formed on the upper surface of the interlayer insulating film 108B; the electrode 8B covering the N$^{++}$-type stopper layer 115 and a part of the oxide film 9B; the semi-insulating film 13B covering the upper surface of the N$^-$-type semiconductor substrate 4 in the presence of the electrode 8B and the oxide film 9B; and the protective film 114B covering the semi-insulating film 13B.

The terminal part 2B is covered by the semi-insulating film 13B at the same potential as the emitter electrode. This achieves screening of electrical influence on the interior of the substrate to be caused by external charge.

As illustrated in FIG. 6, in the semiconductor device of this preferred embodiment, the interface part 3B includes the P$^+$-type well region 5 surrounding the cell part 1B in a plan view. The semiconductor device of this preferred embodiment includes the P-type buffer region 7 surrounding the P$^+$-type well region 5 in a plan view. Further, the semiconductor device of this preferred embodiment includes the electric field relaxing structure 10 surrounding the P-type buffer region 7 in a plan view.

To prevent electric field concentration on the bottom of the trench 14 in the cell part 1B, the lower surface of the P$^+$-type well region 5 is formed at a greater depth than the bottom of the trench 14. In FIG. 6, a depth D5 to the lower surface of the P$^+$-type well region 5 is greater than a depth to the bottom of the trench 14.

The interface part 3B includes the P-type buffer region 7 surrounding the P$^+$-type well region 5 in a plan view. An impurity concentration in the P-type buffer region 7 at the upper surface of the N$^-$-type semiconductor substrate 4 is reduced in a direction from the cell part 1B toward the terminal part 2B.

An end portion of the electrode 8B in the interface part 3B toward the terminal part 2B is internal to (namely, closer to the cell part 1B than) an end portion of the oxide film 9B in the interface part 3B toward the terminal part 2B.

In the terminal part 2B, the electric field relaxing structure 10 is formed into an annular shape in a plan view. The electric field relaxing structure 10 includes a plurality of RESURF layers containing P-type impurities and surrounding the cell part 1B and the interface part 3B in a plan view.

The P$^-$-type diffusion layer $6_1$B, the P$^-$-type diffusion layer $6_2$B, the P$^-$-type diffusion layer $6_3$B, . . . and the P$^-$-type diffusion layer $6_n$B are lower in impurity concentration than the P-type implantation layer $6_1$A, the P-type implantation layer $6_2$A, the P-type implantation layer $6_3$A, . . . and the P-type implantation layer $6_n$A.

The lower surfaces of the P$^-$-type diffusion layer $6_1$B, the P$^-$-type diffusion layer $6_2$B, the P$^-$-type diffusion layer $6_3$B, . . . and the P$^-$-type diffusion layer $6_n$B are at shallower depths than the lower surface of the P$^+$-type well region 5. In FIG. 6, a depth to the lower surfaces of the P$^-$-type diffusion layer $6_1$B, the P$^-$-type diffusion layer $6_2$B, the P$^-$-type diffusion layer $6_3$B, . . . and the P$^-$-type diffusion layer $6_n$B is less than the depth D5 to the lower surface of the P$^+$-type well region 5.

The P$^-$-type diffusion layer $6_1$B forming the P-type RESURF layer $6_1$ closest to the cell part 1B has an end portion toward the cell part 1B contacting the P-type buffer 7 or partially overlapping the P-type buffer region 7.

Meanwhile, an end portion of the P$^-$-type diffusion layer $6_1$B toward the terminal part 2B is connected to at least one of the P$^-$-type diffusion layer $6_2$B, the P$^-$-type diffusion layer $6_3$B, . . . and the P$^-$-type diffusion layer $6_n$B. In FIG. 6, the end portion of the P$^-$-type diffusion layer $6_1$B toward the terminal part 2B is connected to the P$^-$-type diffusion layer $6_2$B, and an end portion of the P⁻-type diffusion layer $6_2$B toward the terminal part 2B is connected to the P⁻-type diffusion layer $6_3$B.

The width w1 of the P-type implantation layer $6_1$A, the width w2 of the P-type implantation layer $6_2$A, the width w3 of the P-type implantation layer $6_3$A, ... and the width wn of the P-type implantation layer $6_n$A become smaller in a direction toward the outer edge of the terminal part 2B.

The width s2 of the interlayer region, the width s3 of the interlayer region, ... and the width sn of the interlayer region become greater in a direction toward the outer edge of the terminal part 2B.

It is assumed that the width s2 of the interlayer region and the width w2 of the P-type implantation layer $6_2$A contacting an end portion of this interlayer region in a direction away from the cell part 1B form one set. Further, the width s3 of the interlayer region and the width w3 of the P-type implantation layer $6_3$A contacting an end portion of this interlayer region in the direction away from the cell part 1B form one set. Further, the width sn of the interlayer region and the width wn of the P-type implantation layer $6_n$A contacting an end portion of this interlayer region in the direction away from the cell part 1B form one set. In this case, the widths of these sets, more specifically, (width s2 of interlayer region+width w2), (width s3 of interlayer region+width w3), and (width sn of interlayer region+width wn) are equal to each other.

Second Preferred Embodiment

A semiconductor device of a second preferred embodiment will be described. In the description given below, a component similar to the component described in the foregoing preferred embodiment will be given the same sign and illustrated with the same sign in the drawing. Detailed description of this component will be omitted, where appropriate.

<Configuration of Semiconductor Device>

Figure 7:
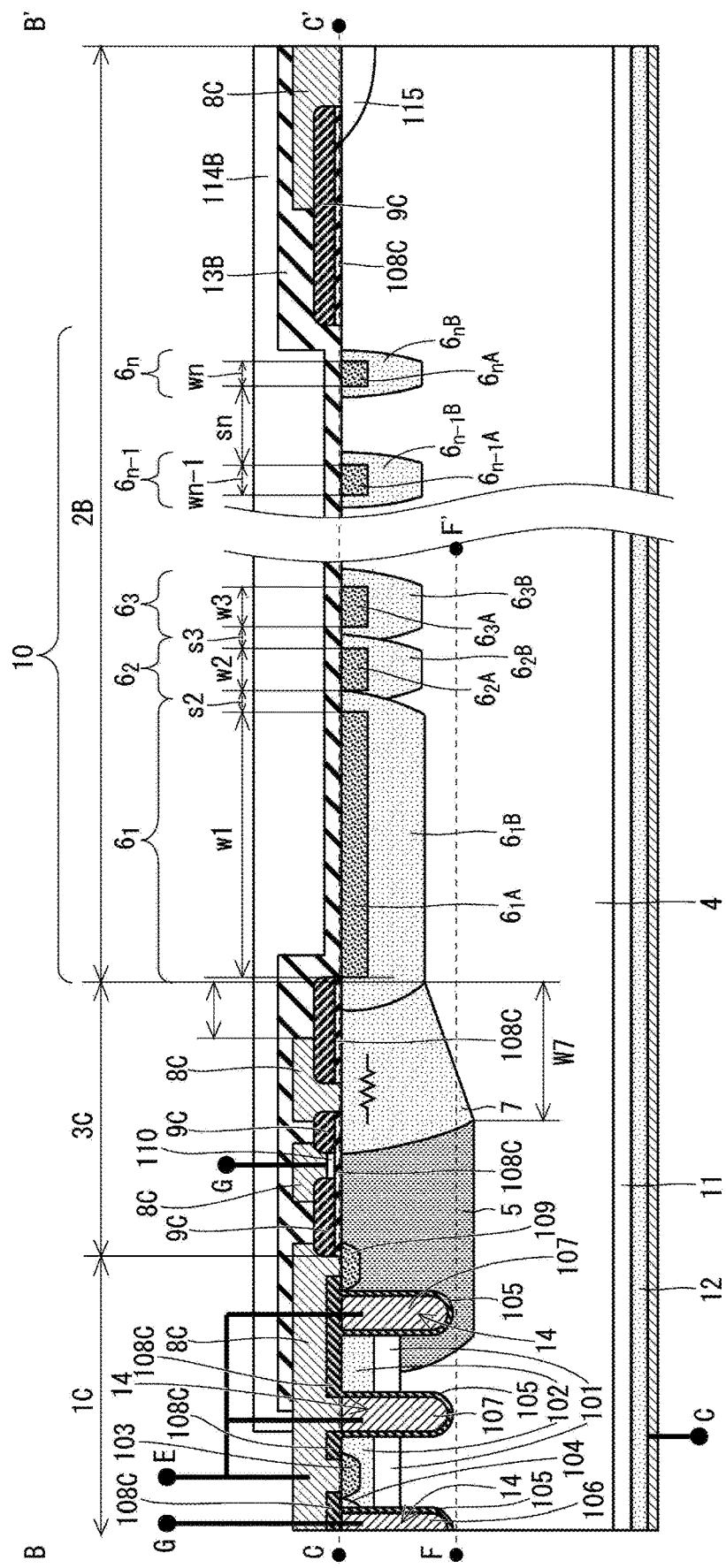
FIG. 7 is a sectional view showing an example of the configuration of a semiconductor device of a preferred embodiment.

FIG. 7 is a sectional view showing an example of the configuration of a semiconductor device of this preferred embodiment. As illustrated in FIG. 7, the semiconductor device of this preferred embodiment includes a cell part 1C, an interface part 3C surrounding the cell part 1C in a plan view, and the terminal part 2B surrounding the interface part 3C in a plan view. FIG. 7 corresponds to a different exemplary sectional view taken along the line B-B' in FIG. 5.

The cell part 1C include: the N⁻-type semiconductor substrate 4; the N-type semiconductor layer 11; the P-type collector layer 12; the collector electrode; the N-type diffusion layer 101; the P-type base layer 102; the P⁺⁺-type contact layer 103; a plurality of trenches 14; the N⁺⁺-type implantation layer 104; the insulating film 105; the gate electrode 106; the emitter electrode 107; an interlayer insulating film 108C formed on the upper surface of the N⁻-type semiconductor substrate 4 while exposing a part of the emitter electrode 107 and the P⁺⁺-type contact layer 103; an electrode 8C covering a part of the emitter electrode 107, the P⁺⁺-type contact layer 103, and the interlayer insulating film 108C; the semi-insulating film 13B partially covering the electrode 8C; and the protective film 114B covering the semi-insulating film 13B and a part of the electrode 8C.

The interface part 3C includes: the N⁻-type semiconductor substrate 4; the N-type semiconductor layer 11; the P-type collector layer 12; the P⁺-type well region 5; the P⁺⁺-type contact layer 109 formed in the surface layer of the P⁺-type well region 5 and connected to the electrode 8C in the cell part 1C; the P-type buffer region 7; the interlayer insulating film 108C partially formed on the upper surface of the N⁻-type semiconductor substrate 4; an oxide film 9C partially formed on the upper surface of the interlayer insulating film 108C; the surface polysilicon gate line 110; the electrode 8C covering the surface polysilicon gate line 110, a part of the oxide film 9C, and an exposed part of the P-type buffer region 7; the semi-insulating film 13B covering the electrode 8C and the oxide film 9C; and the protective film 114B.

The terminal part 2B includes: the N⁻-type semiconductor substrate 4; the N-type semiconductor layer 11; the P-type collector layer 12; the P⁻-type diffusion layer $6_1$B; the P-type implantation layer $6_1$A; the P⁻-type diffusion layer $6_2$B; the P-type implantation layer $6_2$A; the P⁻-type diffusion layer $6_3$B; the P-type implantation layer $6_3$A; the P⁻-type diffusion layer $6_n$B; the P-type implantation layer $6_n$A; the N⁺⁺-type stopper layer 115; the interlayer insulating film 108C partially formed on the upper surface of the N⁻-type semiconductor substrate 4; the oxide film 9C partially formed on the upper surface of the interlayer insulating film 108C; the electrode 8C covering the N⁺⁺-type stopper layer 115 and a part of the oxide film 9C; the semi-insulating film 13B covering the upper surface of the N⁻-type semiconductor substrate 4 in the presence of the electrode 8C and the oxide film 9C; and the protective film 114B.

As illustrated in FIG. 7, in the semiconductor device of this preferred embodiment, the interface part 3C includes the P⁺-type well region 5 surrounding the cell part 1C in a plan view.

The interface part 3C includes the P-type buffer region 7 surrounding the P⁺-type well region 5 in a plan view. An impurity concentration in the P-type buffer region 7 at the upper surface of the N⁻-type semiconductor substrate 4 is reduced in a direction from the cell part 1C toward the terminal part 2B.

An end portion of the electrode 8C in the interface part 3C toward the terminal part 2B is internal to (namely, closer to the cell part 1C than) an end portion of the oxide film 9C in the interface part 3C toward the terminal part 2B.

A part of the P-type buffer region 7 toward the cell part 1C is exposed without being covered by the interlayer insulating film 108C, and the P-type buffer region 7 is connected at this part to the electrode 8C.

In the terminal part 2B, the electric field relaxing structure 10 is formed into an annular shape in a plan view. The electric field relaxing structure 10 includes a plurality of RESURF layers containing P-type impurities and surrounding the cell part 1C and the interface part 3C in a plan view.

The P⁻-type diffusion layer $6_1$B, the P⁻-type diffusion layer $6_2$B, the P⁻-type diffusion layer $6_3$B, ... and the P⁻-type diffusion layer $6_n$B are lower in impurity concentration than the P-type implantation layer $6_1$A, the P-type implantation layer $6_2$A, the P-type implantation layer $6_3$A, ... and the P-type implantation layer $6_n$A.

The P⁻-type diffusion layer $6_1$B forming the P-type RESURF layer $6_1$ closest to the cell part 1C has an end portion toward the cell part 1C contacting the P-type buffer 7 or partially overlapping the P-type buffer region 7.

Meanwhile, an end portion of the P⁻-type diffusion layer $6_1$B toward the terminal part 2B is connected to at least one of the P⁻-type diffusion layer $6_2$B, the P⁻-type diffusion layer $6_3$B, ... and the P⁻-type diffusion layer $6_n$B. In FIG. 7, the end portion of the P⁻-type diffusion layer $6_1$B toward the terminal part 2B is connected to the P⁻-type diffusion layer $6_2B$, and an end portion of the P⁻-type diffusion layer $6_2B$ toward the terminal part 2B is connected to the P⁻-type diffusion layer $6_3B$.

The width w1 of the P-type implantation layer $6_1A$, the width w2 of the P-type implantation layer $6_2A$, the width w3 of the P-type implantation layer $6_3A$, . . . and the width wn of the P-type implantation layer $6_nA$ become smaller in a direction toward the outer edge of the terminal part 2B.

The width s2 of the interlayer region, the width s3 of the interlayer region, . . . and the width sn of the interlayer region become greater in a direction toward the outer edge of the terminal part 2B.

It is assumed that the width s2 of the interlayer region and the width w2 of the P-type implantation layer $6_2A$ contacting an end portion of this interlayer region in a direction away from the cell part 1C form one set. Further, the width s3 of the interlayer region and the width w3 of the P-type implantation layer $6_3A$ contacting an end portion of this interlayer region in the direction away from the cell part 1C form one set. Further, the width sn of the interlayer region and the width wn of the P-type implantation layer $6_nA$ contacting an end portion of this interlayer region in the direction away from the cell part 1C form one set. In this case, the widths of these sets, more specifically, (width s2 of interlayer region+width w2), (width s3 of interlayer region+width w3), and (width sn of interlayer region+width wn) are equal to each other.

Third Preferred Embodiment

A semiconductor device of a third preferred embodiment and a method of manufacturing the semiconductor device will be described. In the description given below, a component similar to the component described in the foregoing preferred embodiments will be given the same sign and illustrated with the same sign in the drawings. Detailed description of this component will be omitted, where appropriate.

<Configuration of Semiconductor Device>

Figure 8:
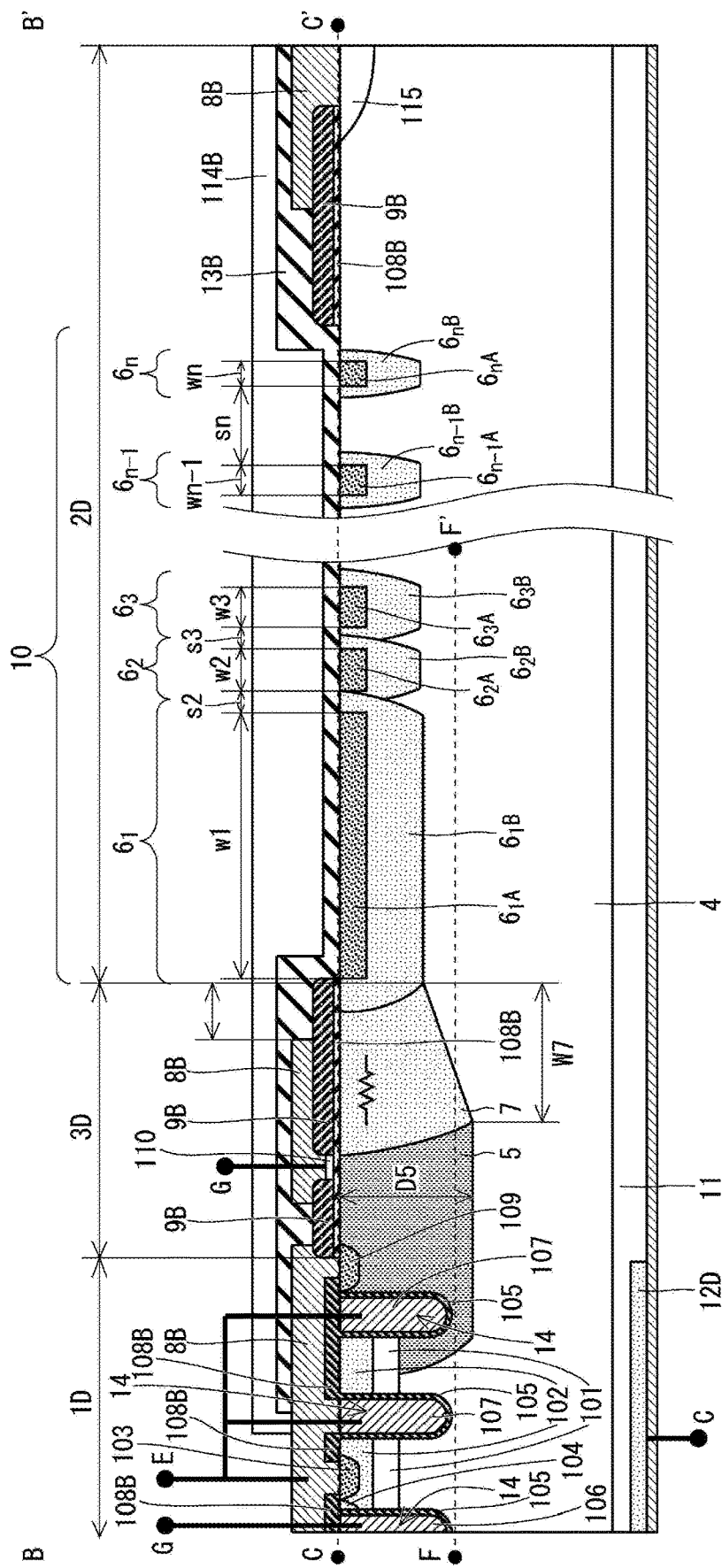
FIG. 8 is a sectional view showing an example of the configuration of a semiconductor device of a preferred embodiment.

FIG. 8 is a sectional view showing an example of the configuration of a semiconductor device of this preferred embodiment. As illustrated in FIG. 8, the semiconductor device of this preferred embodiment includes a cell part 1D, an interface part 3D surrounding the cell part 1D in a plan view, and a terminal part 2D surrounding the interface part 3D in a plan view. FIG. 8 corresponds to a different exemplary sectional view taken along the line B-B' in FIG. 5.

The cell part 1D include: the N⁻-type semiconductor substrate 4; the N-type semiconductor layer 11; a P-type collector layer 12D formed on the lower surface of the N-type semiconductor layer 11; the collector electrode; the N-type diffusion layer 101; the P-type base layer 102; the P⁺⁺-type contact layer 103; a plurality of trenches 14; the N⁺⁺-type implantation layer 104; the insulating film 105; the gate electrode 106; the emitter electrode 107; the interlayer insulating film 108B; the electrode 8B; the semi-insulating film 13B; and the protective film 114B. The P-type collector layer 12D is formed only in the cell part 1D.

The interface part 3D includes: the N⁻-type semiconductor substrate 4; the N-type semiconductor layer 11; the P⁺-type well region 5; the P⁺⁺-type contact layer 109 formed in the surface layer of the P⁺-type well region 5 and connected to the electrode 8B in the cell part 1D; the P-type buffer region 7; the interlayer insulating film 108B formed on the upper surface of the N⁻-type semiconductor substrate 4; the oxide film 9B; the surface polysilicon gate line 110; the electrode 8B; the semi-insulating film 13B; and the protective film 114B.

The terminal part 2D includes: the N⁻-type semiconductor substrate 4; the N-type semiconductor layer 11; the P⁻-type diffusion layer $6_1B$; the P-type implantation layer $6_1A$; the P⁻-type diffusion layer $6_2B$; the P-type implantation layer $6_2A$; the P⁻-type diffusion layer $6_3B$; the P-type implantation layer $6_3A$; the P⁻-type diffusion layer $6_nB$; the P-type implantation layer $6_nA$; the N⁺⁺-type stopper layer 115; the interlayer insulating film 108B; the oxide film 9B; the electrode 8B; the semi-insulating film 13B; and the protective film 114B.

<Concentration Distribution in Each Configuration>

Figure 9:
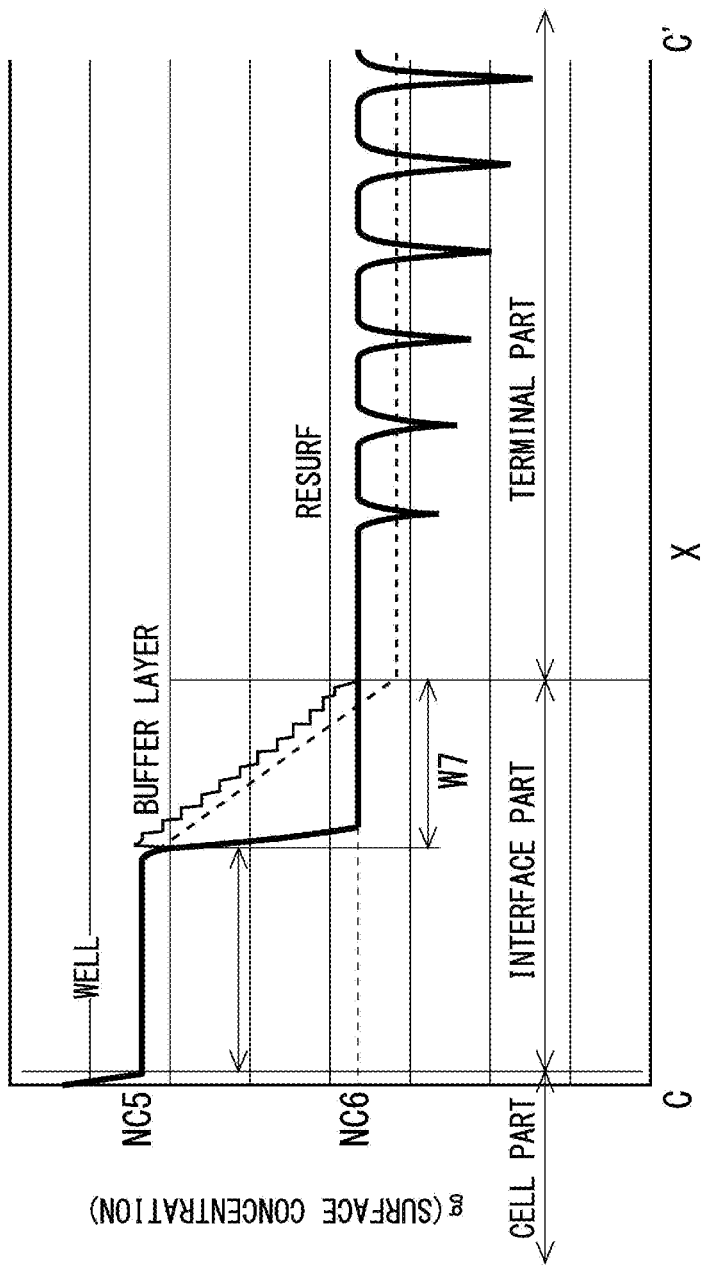
FIG. 9 shows a concentration distribution along a section C-C' in each of the configuration shown in FIG. 6, the configuration shown in FIG. 7, the configuration shown in FIG. 2, and the configuration shown in FIG. 1.

FIG. 9 shows a concentration distribution along a section C-C' in each of the configuration shown in FIG. 6, the configuration shown in FIG. 7, the configuration shown in FIG. 2, and the configuration shown in FIG. 1. In FIG. 9, the vertical axis shows a concentration distribution along the section C-C', and the horizontal axis shows a position on a coordinate from the cell part toward the terminal part. In FIG. 9, a concentration distribution in the configuration shown in FIG. 6 and a concentration distribution in the configuration shown in FIG. 7 are each indicated by solid lines, a concentration distribution in the configuration shown in FIG. 2 is indicated by bold lines, and a concentration distribution in the configuration shown in FIG. 1 is indicated by dotted lines. Comparison is made on the assumption that the same electric field relaxing structure 10 is used in the configuration shown in FIG. 6, in the configuration shown in FIG. 7, and in the configuration shown in FIG. 2.

<Equivalent Circuit>

Figure 10:
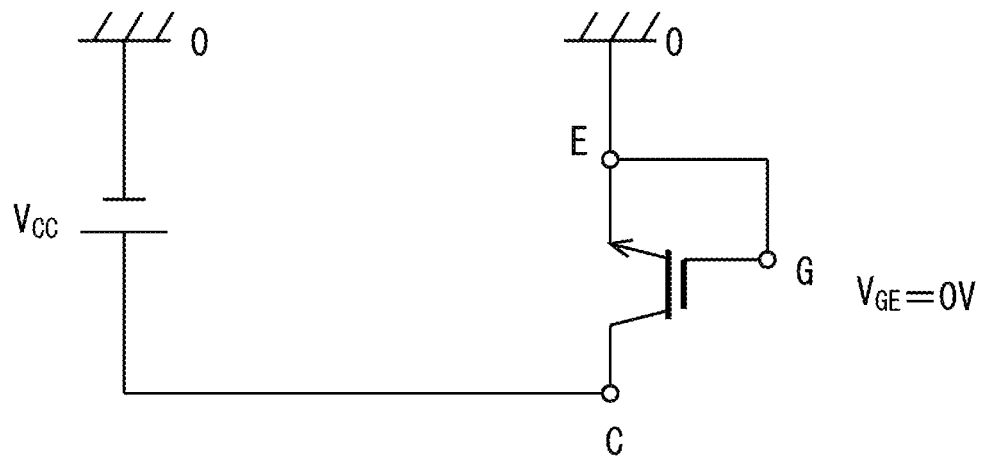
FIG. 10 shows an equivalent circuit of an IGBT during application of a static breakdown voltage.

An equivalent circuit of an IGBT as a semiconductor device during application of a static breakdown voltage will be described. FIG. 10 shows an equivalent circuit of the IGBT during application of a static breakdown voltage.

As shown in FIG. 10, during application of a static breakdown voltage, the emitter terminal and the gate terminal of the IGBT are short-circuited (namely, shorted) to each other. The emitter terminal and the gate terminal of the IGBT are connected to the ground. Meanwhile, the collector terminal of the IGBT is connected to a positive power supply voltage.

Figure 11:
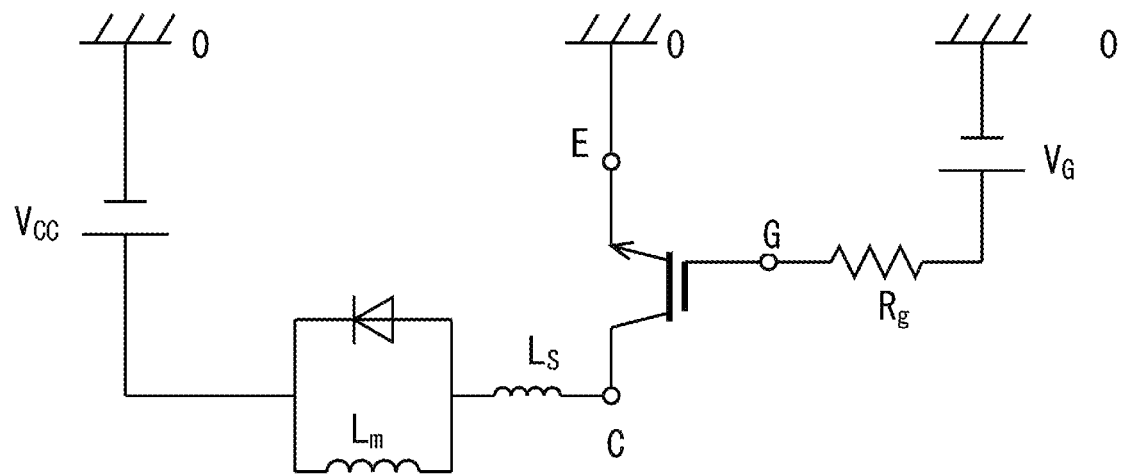
FIG. 11 shows an equivalent circuit of the IGBT in a switching mode.

An equivalent circuit of the IGBT as a semiconductor device in a switching mode will be described next. FIG. 11 shows an equivalent circuit of the IGBT in the switching mode. In FIG. 11, a positive power supply voltage is 1800 V, a temperature is 423 K, a gate voltage is around 15 V, and a circuit parasitic inductance Ls is 2.47 µH.

As shown in FIG. 11, in the switching mode, the emitter terminal of the IGBT is connected to the ground, and the gate terminal of the IGBT is connected to the gate voltage through a gate resistor Rg.

The collector terminal of the IGBT is connected to the positive power supply, voltage through the circuit parasitic inductance Ls and a load inductance Lm.

<Electric Field Distribution in Each Configuration>

Figure 12:
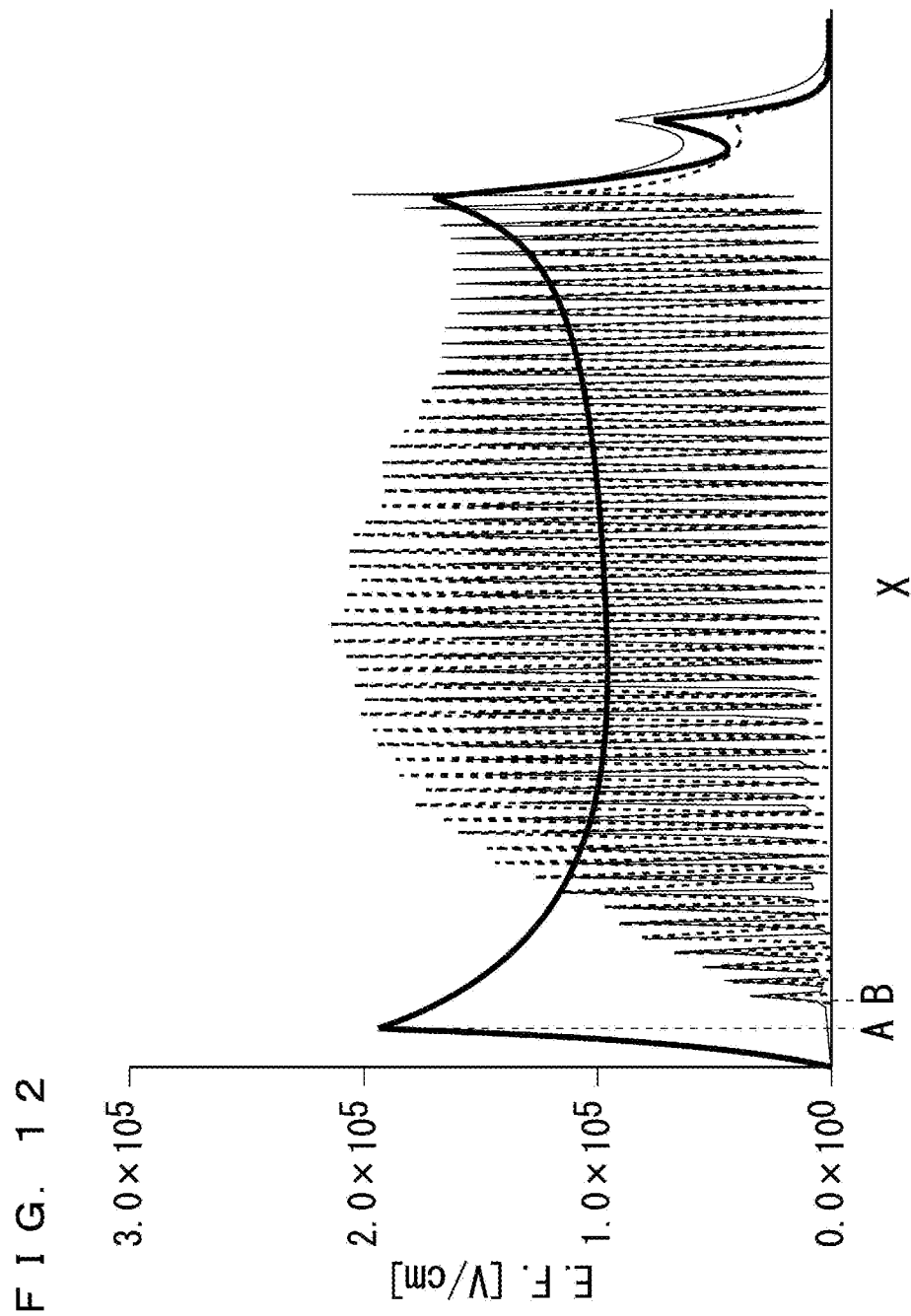
FIG. 12 shows an electric field distribution under a condition for an optimum RESURF implantation dose along a section C-C' in each of the configuration shown in FIG. 6, the configuration shown in FIG. 7, the configuration shown in FIG. 2, and the configuration shown in FIG. 1.

FIG. 12 shows an electric field distribution under a condition for an optimum RESURF implantation dose along the section C-C' in each of the configuration shown in FIG. 6, the configuration shown in FIG. 7, the configuration shown in FIG. 2, and the configuration shown in FIG. 1. In FIG. 12, the vertical axis shows an electric field distribution [V/cm] along the section C-C', and the horizontal axis shows a position on a coordinate from the cell part toward the terminal part. In FIG. 12, an electric field distribution in the configuration shown in FIG. 6 and an electric field distribution in the configuration shown in FIG. 7 are indicated by dotted lines, an electric field distribution in the configuration shown in FIG. 2 is indicated by solid lines, and an electric field distribution in the configuration shown in FIG. 1 is indicated by bold lines A point A in FIG. 12 corresponds to an end portion of the P$^+$-type well region toward the terminal part in each configuration. A point B in FIG. 12 corresponds to an end portion of the P$^-$-type diffusion layer $6_1$B toward the terminal part in each configuration.

As shown in FIG. 12, in the configuration shown in FIG. 1, an electric field concentrates on an end portion of the P$^+$-type well region 5 toward the terminal part 2 and an end portion of the RESURF layer 6 toward the terminal part 2.

By contrast, in the configuration shown in FIG. 6, in the configuration shown in FIG. 7, and in the configuration shown in FIG. 2, the presence of a plurality of RESURF layers (namely, P-type RESURF layer $6_1$, P-type RESURF layer $6_2$, P-type RESURF layer $6_3$, . . . P-type RESURF layer $6_n$) in the electric field relaxing structure 10 makes it possible to suppress electric field concentration on the end portion of the P$^+$-type well region toward the terminal part.

In the configuration shown in FIG. 2, a RESURF implantation dose is required to be increased to a level approximate to an upper limit of a permissible range for preventing reduction in Ic(break). However, this intensifies an electric field near the outer edge of the terminal part 2A. More specifically, increasing a RESURF implantation dose may make a static breakdown voltage of a semiconductor device unstable.

By contrast, in the configuration shown in FIG. 6 and in the configuration shown in FIG. 7, the presence of the P-type buffer region 7 between the P$^+$-type well region 5 and the P-type implantation layer $6_1$A makes it possible to decrease a lower limit of the permissible range for a RESURF implantation dose. Thus, an ideal electric field distribution of a shape like a trapezoid is more likely to be achieved than in the configuration shown in FIG. 2. More specifically, the need to increase a RESURF implantation dose is eliminated while reduction in Ic(break) is prevented, making it possible to maintain the stability of a static breakdown voltage of a semiconductor device.

<Margin for RESURF Implantation Dose in Each Configuration>

Figure 13:
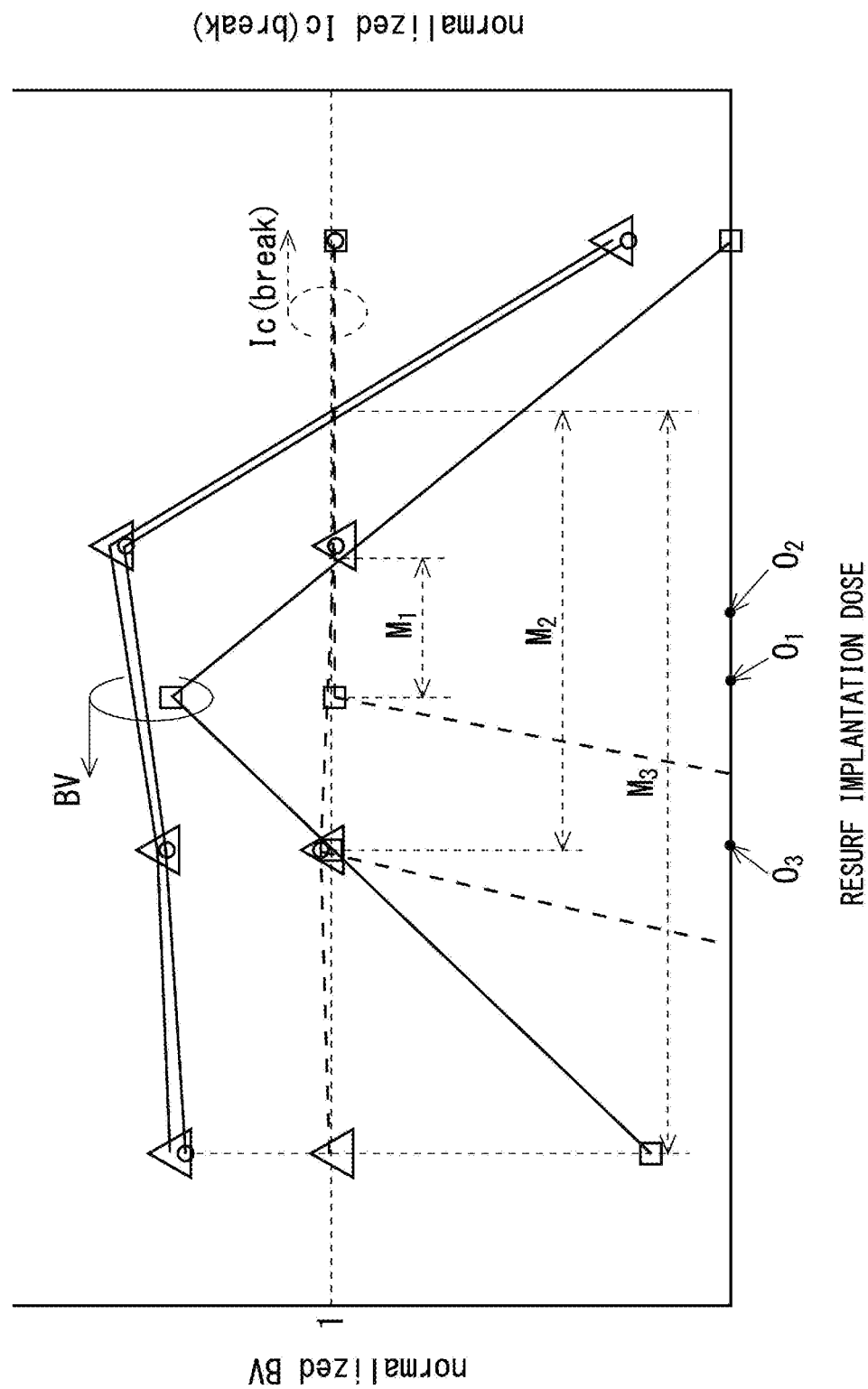
FIG. 13 shows the dependence of a RESURF implantation dose on BV and Ic(break) in each of the configuration shown in FIG. 6, the configuration shown in FIG. 7, the configuration shown in FIG. 2, and the configuration shown in FIG. 1.

FIG. 13 shows the dependence of a RESURF implantation dose on BV and Ic(break) in each of the configuration shown in FIG. 6, the configuration shown in FIG. 7, the configuration shown in FIG. 2, and the configuration shown in FIG. 1. In FIG. 13, the left vertical axis shows BV (a voltage normalized at a target static breakdown voltage), the right vertical axis shows Ic(break) (a current normalized at maximum Ic(break)), and the horizontal axis shows a RESURF implantation dose. In FIG. 13, the dependence of an implantation dose on BV in each of the configuration shown in FIG. 6 and the configuration shown in FIG. 7 is indicated by solid lines connected with triangles, and the dependence of the implantation dose on Ic(break) in each of the configuration shown in FIG. 6 and the configuration shown in FIG. 7 is indicated by dotted lines connected with triangles. Further, the dependence of an implantation dose on BV in the configuration shown in FIG. 2 is indicated by solid lines connected with circles, and the dependence of the implantation dose on Ic(break) in the configuration shown in FIG. 2 is indicated by dotted lines connected with circles. Further, the dependence of an implantation dose on BV in the configuration shown in FIG. 1 is indicated by solid lines connected with rectangles, and the dependence of the implantation dose on Ic(break) in the configuration shown in FIG. 1 is indicated by dotted lines connected with rectangles.

A range in which both a normalized value relative to BV and a normalized value relative to Ic(break) exceed 1 corresponds to a permissible range (process margin) for a RESURF implantation dose in each configuration.

As illustrated in FIG. 13, the process margin is narrowest in the configuration shown in FIG. 1. Meanwhile, the configuration shown in FIG. 2, the configuration shown in FIG. 6, and the configuration shown in FIG. 7 include the electric field relaxing structures 10 of similar configurations, so that the dependence of a RESURF implantation dose on BV is at similar degrees in these configurations.

Meanwhile, in the configuration shown in FIG. 6 and in the configuration shown in FIG. 7, no reduction is observed in a value relative to Ic(break) in a range where a RESURF implantation dose is relatively low. This shows that each of the configuration shown in FIG. 6 and the configuration shown in FIG. 7 allows decrease in a lower limit of the permissible range for a RESURF implantation dose compared to the configuration shown in FIG. 2, thereby achieving a wide process margin for a RESURF implantation dose.

FIG. 13 shows a process margin $M_1$ for the configuration shown in FIG. 1, a process margin $M_2$ for the configuration shown in FIG. 2, arid a process margin $M_3$ for the configuration shown in FIG. 6 and the configuration shown in FIG. 7. FIG. 13 further shows an optimum $O_1$, an optimum $O_2$, and an optimum $O_3$ of RESURF implantation doses in corresponding process margins.

<Peak Temperature and Electric Field Distribution in Each Configuration>

Figure 14:
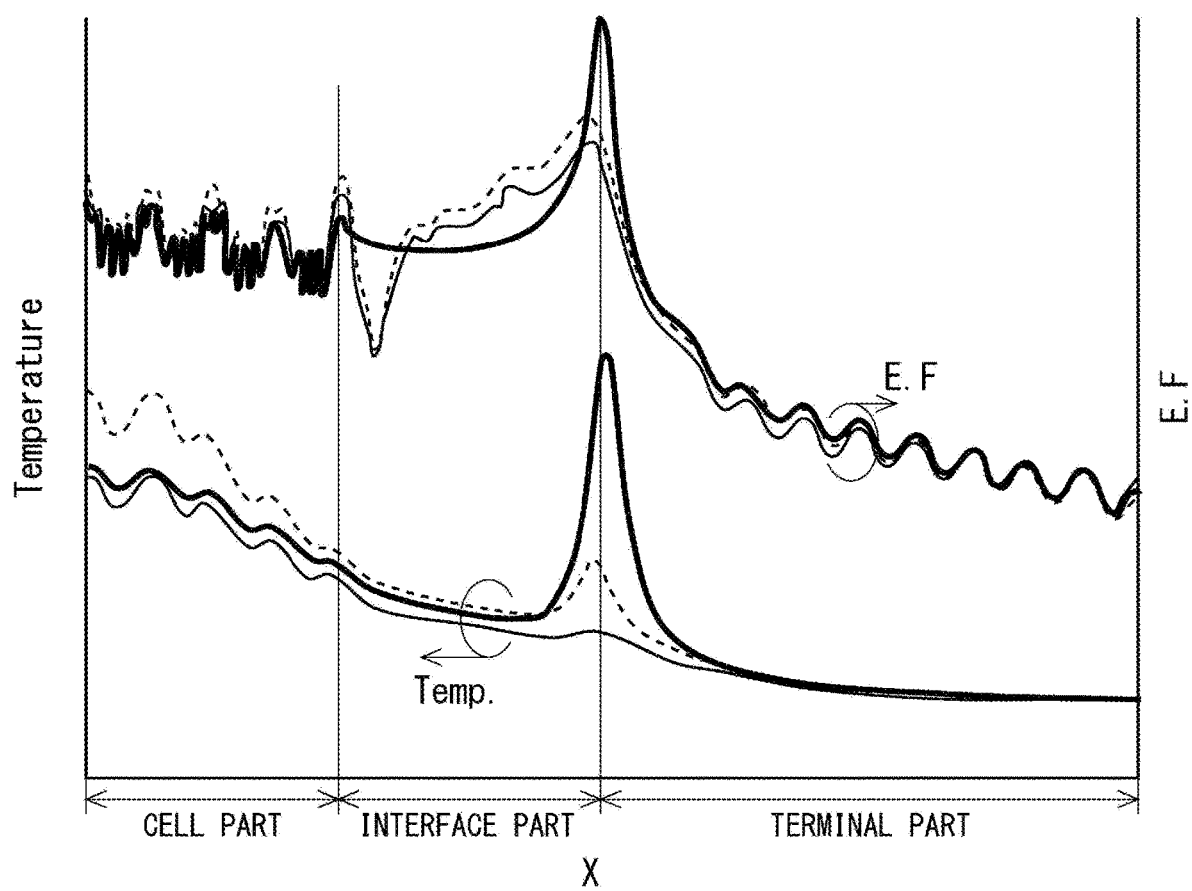
FIG. 14 shows a peak temperature and an electric field distribution during turn-off shutdown operation along a section F-F' in each of the configuration shown in FIG. 6, the configuration shown in FIG. 7, and the configuration shown in FIG. 2.

FIG. 14 shows a peak temperature and an electric field distribution during turn-off shutdown operation along a section F-F' in each of the configuration shown in FIG. 6, the configuration shown in FIG. 7, and the configuration shown in FIG. 2. In FIG. 14, the left vertical axis shows a temperature, the right vertical axis shows an electric field distribution [V/cm] along the section F-F', and the horizontal axis shows a position on a coordinate from the cell part toward the terminal part. In FIG. 14, a peak temperature and an electric field distribution in the configuration shown in FIG. 6 are indicated by solid lines, a peak temperature and an electric field distribution in the configuration shown in FIG. 7 are indicated by dotted lines, and a peak temperature and an electric field distribution in the configuration shown in FIG. 2 are indicated by bold lines.

As illustrated in FIG. 14, in each of the configuration shown in FIG. 6 and the configuration shown in FIG. 7, both a peak temperature at a boundary between the interface part and the terminal part and electric field intensity at the boundary between the interface part and the terminal part are suppressed, compared to the configuration shown in FIG. 2.

In each of the configuration shown in FIG. 6 and the configuration shown in FIG. 7, an impurity concentration in the P-type buffer region 7 at the upper surface of the N-$^-$-type semiconductor substrate 4 is reduced in a direction from the cell part toward the terminal part. Further, an end portion of the P-type buffer region 7 toward the cell part and an end portion of the P$^+$-type well region 5 toward the terminal part are connected to each other. As a result, the P$^+$-type well region 5 and the P-type buffer region 7 can be regarded as a PN junction having a large curvature at one end portion.

The large curvature at the end portion of the PN junction allows suppression of electric field concentration on this end portion. Relaxed electric field concentration can reduce a current to be caused by collisional ionization (impact ionization), and this reduces a current density at this end portion.

As a result, heat generation resulting from current concentration on the boundary between the interface part and the terminal part is suppressed. This suppresses thermal breakdown at this boundary to allow improvement of turn-off shutdown performance.

Referring to FIG. 14, unlike in the configuration shown in FIG. 7, a part of the P-type buffer region 7 toward the cell part is not connected to an electrode in an upper layer in the configuration shown in FIG. 6.

A current flows in the surface layer of the N$^-$-type semiconductor substrate 4 in the interface part during turn-off shutdown operation. This makes the P$^+$-type well region 5 and the P-type buffer region 7 further function as a resistor in an equivalent circuit.

In this case, in the configuration shown in FIG. 6, the absence of a contact at a place between the P-type buffer region 7 and the electrode in the upper layer makes a current path longer than a current path formed in the configuration shown in FIG. 7 in which a contact is formed at this place. Thus, the configuration shown in FIG. 6 is to have a component of a high resistance.

A higher resistance of the component increases voltage sharing at this place to result in corresponding reduction in voltage sharing at the boundary between the interface part and the terminal part. As a result, electric field intensity and a current resulting from impact ionization are reduced at the boundary between the interface part and the terminal part, making it possible to suppress heat generation at this boundary.

In the configuration shown in FIG. 8, the collector layer 12D is absent from the interface part 3D and the terminal part 2D. Such a configuration makes it possible to suppress a current from the interface part 3D and the terminal part 2D.

As a result, a current to flow in a boundary between the interface part 3D and the terminal part 2D is reduced to allow suppression of heat generation. In this way, turn-off shutdown performance is improved.

In the foregoing electric field relaxing structure 10, to realize an ideal electric field distribution of a shape like a trapezoid during application of a static breakdown voltage, a surface concentration NC6 [cm$^{-3}$] in the P-type implantation layer $6_1$A, the P-type implantation layer $6_2$A, the P-type implantation layer $6_3$A, . . . and the P-type implantation layer $6_n$A, and a surface concentration NC5 [cm$^{-3}$] in the P$^+$-type well region 5 satisfy the following formula (1):

$$NC6 = 0.1 \text{ to } 0.001 \times NC5 \quad \text{Formula (1)}$$

In the foregoing electric field relaxing structure 10, to realize an ideal electric field distribution of a shape like a trapezoid during application of a static breakdown voltage, the depth D6 [μm] of the lower surfaces of the P-type implantation layer $6_1$A, the P-type implantation layer $6_2$A, the P-type implantation layer $6_3$A, . . . and the P-type implantation layer $6_n$A, and the depth D5 [μm] of the lower surface of the P$^+$-type well region 5 satisfy the following formula (2):

$$D5 - D6 \geq 1 \quad \text{Formula (2)}$$

In the formula (1), excess of NC6 [cm$^{-3}$] over the foregoing range causes an electric field distribution to concentrate at a part of the electric field relaxing structure 10 toward the cell part or toward the terminal part of the electric field relaxing structure 10.

In the formula (2), a difference between D5 [μm] and D6 [μm] not satisfying the foregoing condition unintentionally weakens the effect of the increased curvature at the end portion of the PN junction produced by the provision of the P-type buffer region 7. This reduces the effect of suppressing electric field concentration.

To achieve the effect of the increased curvature at the end portion of the PN junction produced by the provision of the P-type buffer region 7, a width w7 [μm] of the P-type buffer region 7, the surface concentration NC6 [cm$^{-3}$] in the P-type implantation layer $6_1$A, the P-type implantation layer $6_2$A, the P-type implantation layer $6_3$A, . . . and the P-type implantation layer $6_n$A, the surface concentration NC5 [cm$^{-3}$] in the P$^+$-type well region 5, and a thermal diffusion coefficient c of impurities satisfy a relationship defined by the following formula (3):

$$W7 \geq 0.6 \sim 0.8 \times \sqrt{\left(c \times ln\left(\frac{NC5}{Nc6}\right)\right)} \quad \text{Formula (3)}$$

<Method of Manufacturing Each Configuration>

Figure 15:
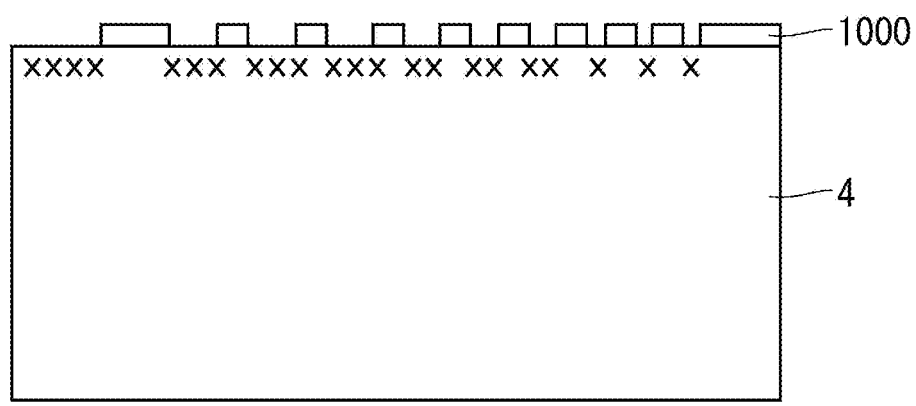
FIGS. 15 and 16 are sectional views showing a method of manufacturing a P-type buffer region in a simplified manner.
Figure 16:
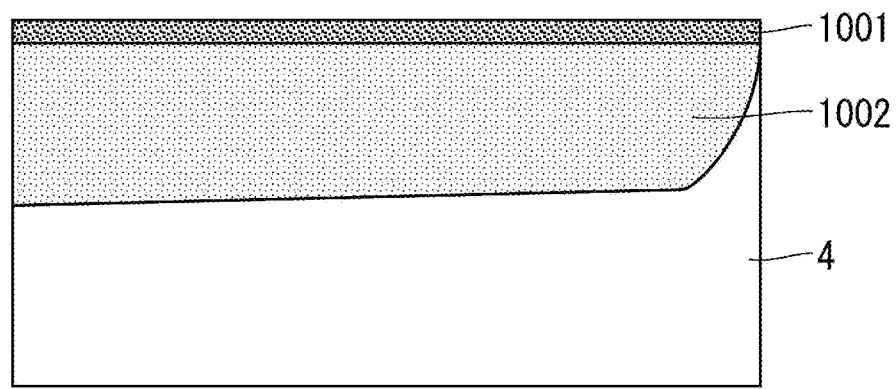

FIGS. 15 and 16 are sectional views showing a method of manufacturing the P-type buffer region 7 in a simplified manner.

As illustrated in FIG. 15, an implantation mask 1000 is given a pattern with different depths of implantation windows and different intervals between the implantation windows using photolithography technique. By doing so, it becomes possible to form a region with a large dose of impurities and a region with a low dose of the impurities simultaneously in the surface layer of the N$^-$-type semiconductor substrate 4.

Both implantation windows of stripe patterns and implantation windows of dot patterns can be provided in this way to the implantation mask 1000.

As illustrated in FIG. 16, a diffusion region 1002 in which a concentration changes continuously can be formed by diffusing the impurities in a depth direction and a horizontal direction in an impurity layer 1001 formed in the upper surface of the N$^-$-type semiconductor substrate 4 by drive-in process.

Figure 17:
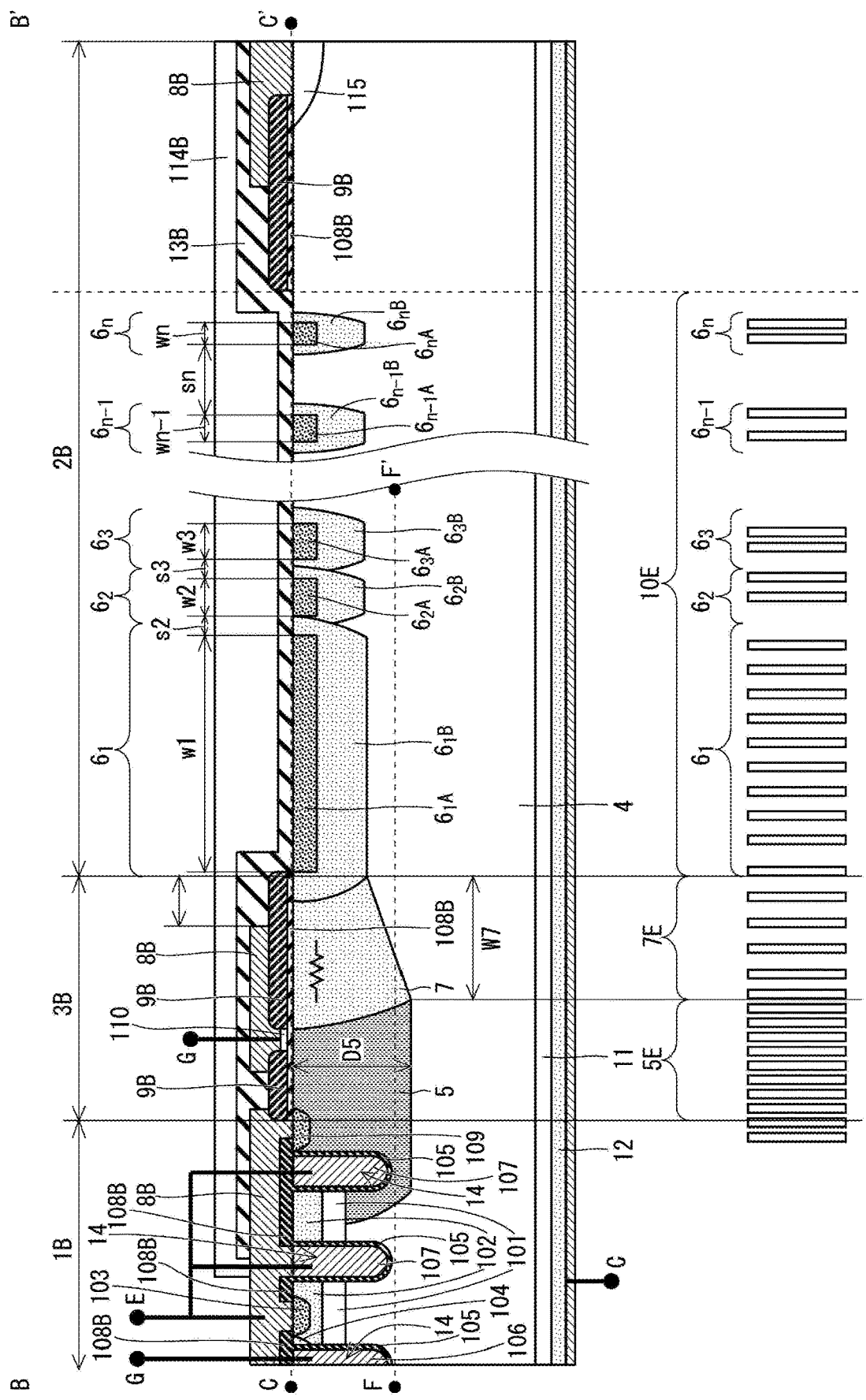
FIG. 17 is a sectional view showing an example of a configuration in which a P$^+$-type well region, a P-type buffer region, and an electric field relaxing structure have different forms from those in the configuration shown in FIG. 6.

FIG. 17 is a sectional view showing an example of a configuration in which the P$^+$-type well region 5, the P-type buffer region 7, and the electric field relaxing structure 10 have different forms from those in the configuration shown in FIG. 6. FIG. 17 further shows the shapes of a P$^+$-type well region 5E, a P-type buffer region 7E, and an electric field relaxing structure 10E in a plan view in relation to their shapes in the sectional view. In this case, while the P$^+$-type well region 5, the P-type buffer region 7, the P-type RESURF layer $6_1$, the P-type RESURF layer $6_2$, the P-type RESURF layer $6_3$, . . . and the P-type RESURF layer $6_n$ in the configuration shown in FIG. 6 are shown in this sectional view, these regions and layers are illustrated to clearly show relation with the arrangements of the P$^+$-type well region 5E, the P-type buffer region 7E, and the electric field relaxing structure 10E. In an actual configuration, layer structures of shapes corresponding to the P$^+$-type well region 5E, the P-type buffer region 7E, and the electric field relaxing structure 10E are formed at the related positions.

As illustrated in FIG. 17, in the plan view, the P$^+$-type well region 5E, the P-type buffer region 7E, and the electric field relaxing structure 10E are entirely or partially formed into stripe patterns.

Figure 18:
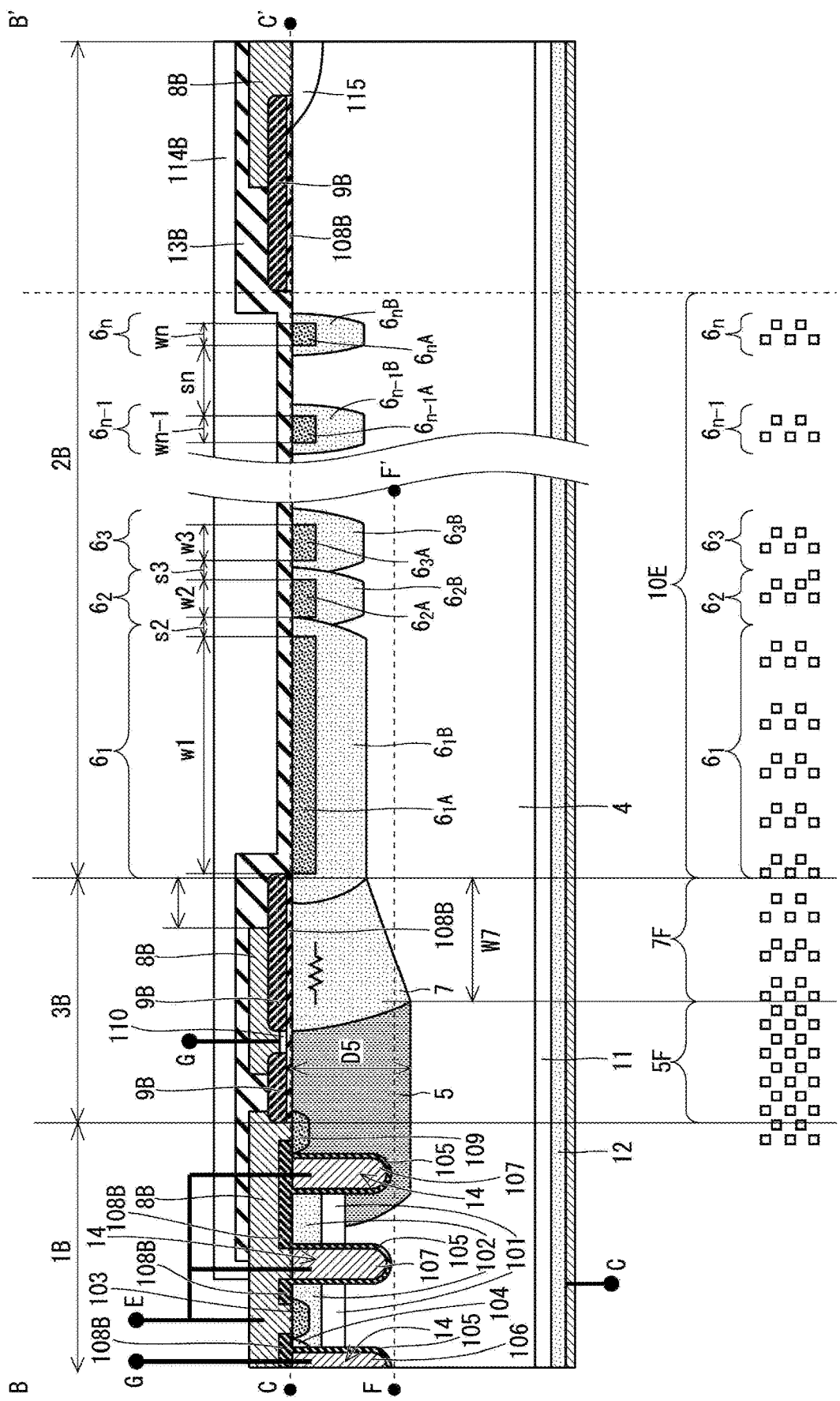
FIG. 18 is a sectional view showing an example of a configuration in which the P$^+$-type well region, the P-type buffer region, and the electric field relaxing structure have different forms from those in the configuration shown in FIG. 6.

FIG. 18 is a sectional view showing an example of a configuration in which the P+-type well region 5, the P-type buffer region 7, and the electric field relaxing structure 10 have different forms from those in the configuration shown in FIG. 6. FIG. 18 further shows the shapes of a P+-type well region 5F, a P-type buffer region 7F, and an electric field relaxing structure 1OF in a plan view in relation to their shapes in the sectional view. In this case, while the P+-type well region 5, the P-type buffer region 7, the P-type RESURF layer $6_1$, the P-type RESURF layer $6_2$, the P-type RESURF layer $6_3$, . . . and the P-type RESURF layer $6_n$ in the configuration shown in FIG. 6 are shown in this sectional view, these regions and layers are illustrated to clearly show relation with the arrangements of the P+-type well region 5F, the P-type buffer region 7F, and the electric field relaxing structure 10F. In an actual configuration, layer structures of shapes corresponding to the P+-type well region 5F, the P-type buffer region 7F, and the electric field relaxing structure 1OF are formed at the related positions.

As illustrated in FIG. 18, in the plan view, the P+-type well region 5F, the P-type buffer region 7F, and the electric field relaxing structure 10F are entirely or partially formed into dotted patterns. Here, a square is illustrated as an example of the shape of the dots.

Figure 19:
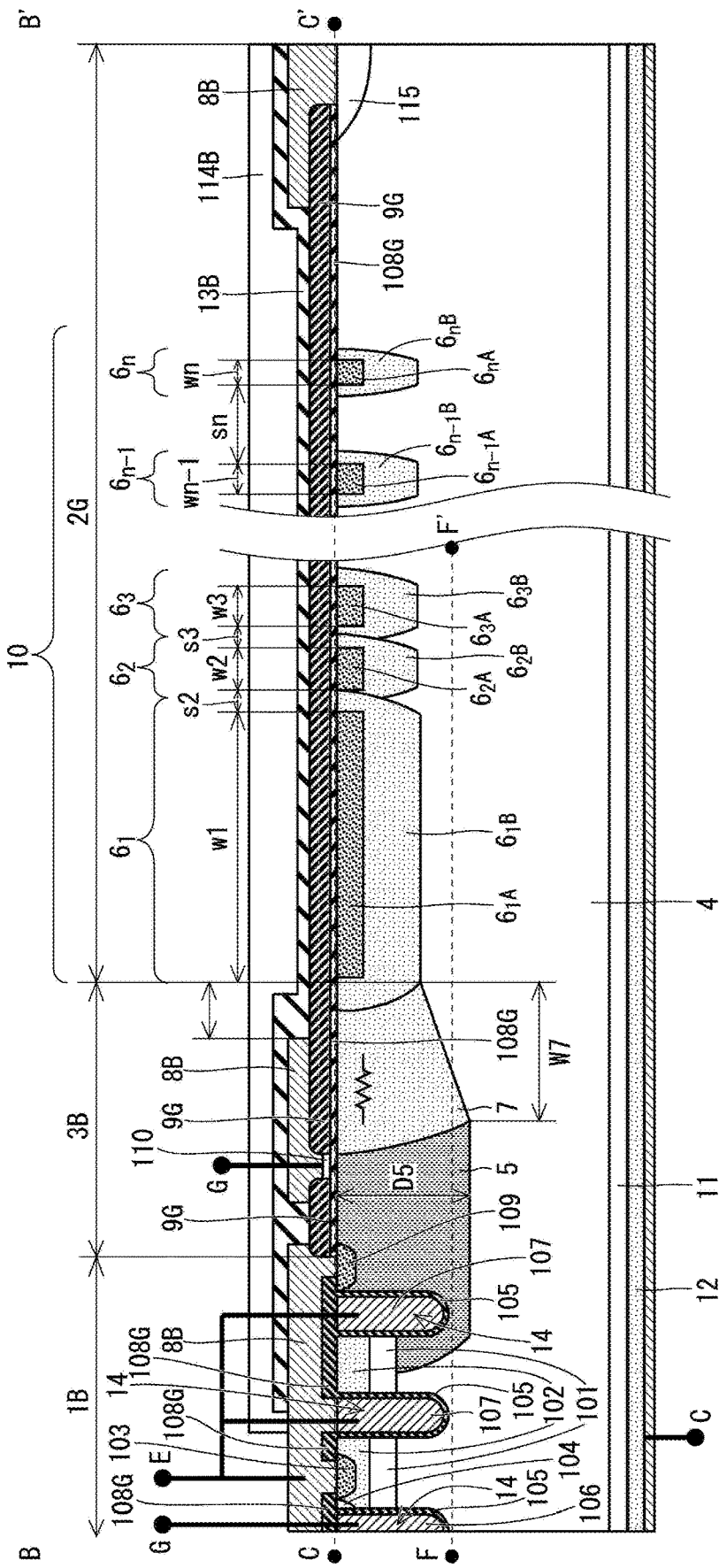
FIG. 19 is a sectional view showing an example of a configuration in which an interlayer insulating film and an oxide film have different forms from those in the configuration shown in FIG. 6.

FIG. 19 is a sectional view showing an example of a configuration in which the interlayer insulating film 108B and the oxide film 9B have different forms from those in the configuration shown in FIG. 6.

As illustrated in FIG. 19, an interlayer insulating film 108G and an oxide film 9G are formed entirely on the upper surface of the N−-type semiconductor substrate 4 in a terminal part 2G.

Figure 20:
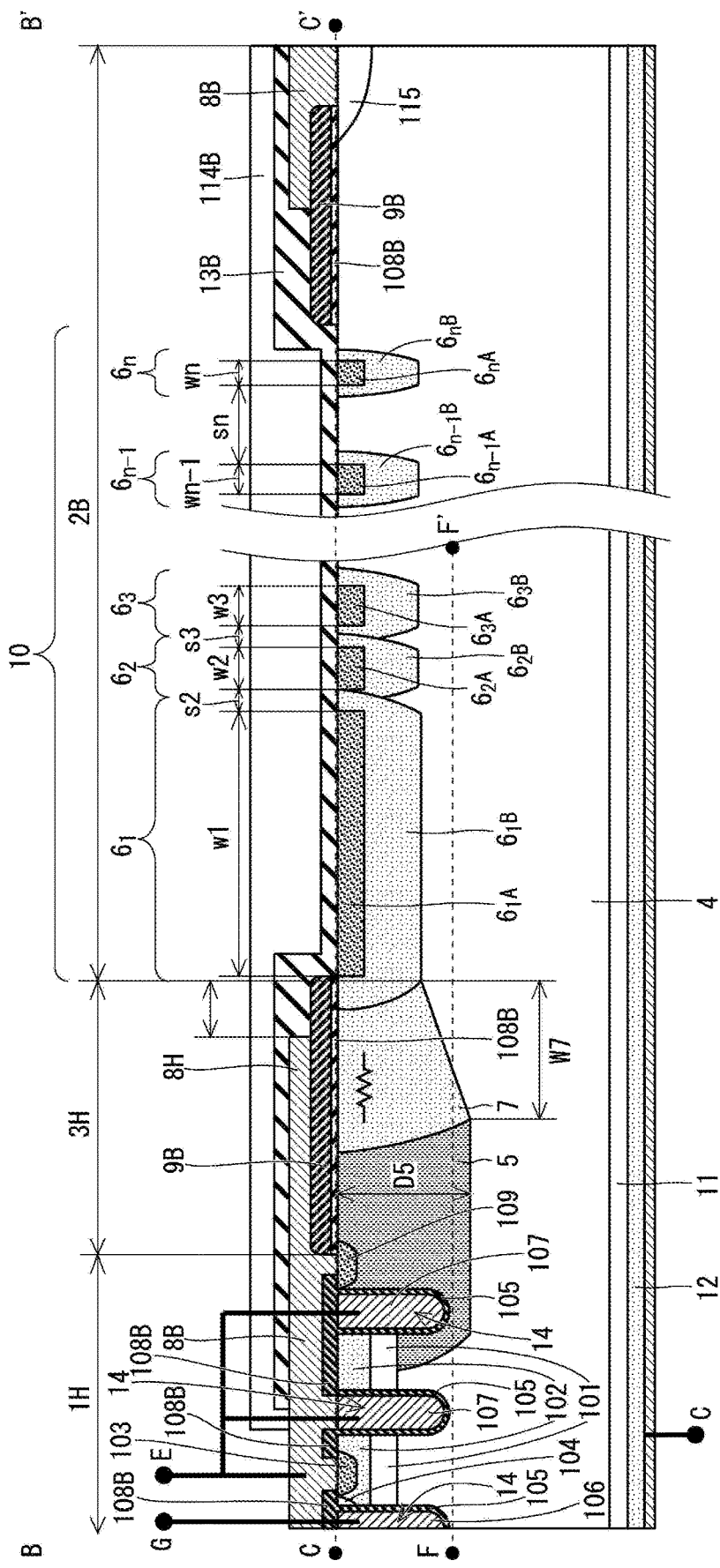
FIG. 20 is a sectional view showing an example of a configuration in which an electrode has a different form from that in the configuration shown in FIG. 6.

FIG. 20 is a sectional view showing an example of a configuration in which the electrode 8B has a different form from that in the configuration shown in FIG. 6.

As illustrated in FIG. 20, an electrode 8H includes a part formed in the cell part 1B and a part formed in the interface part 3B, and these parts are continuous with each other. By doing so, the electrode 8H formed in an interface part 3H is directly connected to the N++-type implantation layer 104 in a cell part 1H.

<Effects Achieved by Foregoing Preferred Embodiments>

Exemplary effects achieved by the foregoing preferred embodiments will be described next. These effects in the following description are achieved based on the specific configurations illustrated in the foregoing preferred embodiments. However, these configurations may be replaced by different specific configurations illustrated in this specification, as long as comparable effects are achieved by such different specific configurations.

Such replacement may be done across a plurality of preferred embodiments. More specifically, configurations illustrated in different preferred embodiments may be combined to achieve comparable effects.

According to the foregoing preferred embodiments, the semiconductor device includes the semiconductor substrate 4 of the N−-type (first conductivity type), the well region 5 of the P+-type (second conductivity type), the buffer region 7 of the P-type (second conductivity type), the insulating film, the electrode 8B, and the electric field relaxing structure 10 of the second conductivity type. The insulating film mentioned herein corresponds to at least one of the interlayer insulating film 108B and the oxide film 9B. The well region 5 surrounds an active region in a plan view. The active region mentioned herein is a region in which an element structure is formed in the surface layer of the semiconductor substrate 4. The well region 5 is formed in the surface layer of the semiconductor substrate 4. The buffer region 7 surrounds the well region 5 in a plan view. The buffer region 7 is formed in the surface layer of the semiconductor substrate 4. The insulating film is formed on the upper surface of the well region 5 and on the upper surface of the buffer region 7. The electrode 8B is formed on the upper surface of the oxide film 9B. The electric field relaxing structure 10 surrounds the buffer region 7 in a plan view. The electric field relaxing structure 10 is formed in the surface layer of the semiconductor substrate 4. The buffer region 7 contacts the well region 5. An impurity concentration in the buffer region 7 is reduced in a direction away from the active region. An end portion of the electrode 8B away from the active region (namely, an end portion toward the terminal part 2B) is located at a position closer to the active region (namely, closer to the cell part 1B) than an end portion of the buffer region 7 away from the active region (namely, an end portion toward the cell part 1B). The electric field relaxing structure 10 includes a plurality of RESURF layers of the second conductivity type: the RESURF layer $6_1$, the RESURF layer $6_2$, the RESURF layer $6_3$, . . . and the RESURF layer $6_n$. The RESURF layer $6_1$, the RESURF layer $6_2$, the RESURF layer $6_3$, . . . and the RESURF layer $6_n$ each surround the buffer region 7 in a plan view. The RESURF layer $6_1$, the RESURF layer $6_2$, the RESURF layer $6_3$, . . . and the RESURF layer $6_n$ are formed in the surface layer of the semiconductor substrate 4. The RESURF layer $6_1$ closest to the active region contacts the buffer region 7. At least two RESURF layers in order of increasing distance from the active region, the RESURF layer $6_1$ and the RESURF layer $6_2$, contact each other.

This configuration allows suppression of electric field concentration on a boundary between the interface part 3B and the terminal part 2B during turn-off shutdown operation in addition to suppression of electric field concentration during application of a static breakdown voltage. Thus, it becomes possible to increase a process margin by alleviating the dependence of a RESURF implantation dose on a static breakdown voltage while reduction in Ic(break) is prevented. By doing so, the stability of the static breakdown voltage of the semiconductor device is maintained.

Even if at least one of the different structures illustrated in this specification, specifically, a different one of the structures illustrated in this specification and not listed as one of the foregoing structures added appropriately to the foregoing structures, effects comparable to the foregoing effects are still achieved.

According to the foregoing preferred embodiments, each of the RESURF layers includes a diffusion layer of the N−-type (second conductivity type) and an implantation layer of the P-type (second conductivity type). For example, the RESURF layer $6_1$ includes the diffusion layer $6_1B$ and the implantation layer $6_1A$. The diffusion layer $6_1B$, the diffusion layer $6_2B$, the diffusion layer $6_3B$ . . . and the diffusion layer $6_nB$ surround the buffer region 7 in a plan view. The diffusion layer $6_1B$, the diffusion layer $6_2B$, the diffusion layer $6_3B$, . . . and the diffusion layer $6_nB$ are formed in the surface layer of the semiconductor substrate 4. The implantation layer $6_1A$, the implantation layer $6_2A$, the implantation layer $6_3A$, . . . and the implantation layer $6_nA$ are formed in the surface layers of corresponding ones of the diffusion layer $6_1B$, the diffusion layer $6_2B$, the diffusion layer $6_3B$, . . . and the diffusion layer $6_nB$. The implantation layer $6_1A$, the implantation layer $6_2A$, the implantation layer $6_3A$, . . . and the implantation layer $6_nA$ are higher in impurity concentration than corresponding ones of the diffusion layer $6_1B$, the diffusion layer $6_2B$, the diffusion layer $6_3B$, . . . and the diffusion layer $6_nB$. The diffusion layer $6_1B$ of the RESURF layer $6_1$ closest to the active region contacts the buffer region 7. The diffusion layer $6_1B$ and the diffusion layer $6_2B$ of at least two RESURF layers $6_1$ and $6_2$ respectively in order of increasing distance from the active region contact each other. The width s2, the width s3, . . . and the width sn of the interlayer regions between the implantation layer $6_1A$, the implantation layer $6_2A$, the implantation layer $6_3A$, . . . and the implantation layer $6_nA$ become greater as the positions of the interlayer regions get farther from the active region. The width w2 of the implantation layer $6_2A$, the width w3 of the implantation layer $6_3A$, and the width wn of the implantation layer $6_nA$ of corresponding ones of a plurality of RESURF layers $6_2$, $6_3$, and $6_n$ except the RESURF layer $6_1$ closest to the active region become smaller as the positions of corresponding ones of the implantation layer $6_2A$, the implantation layer $6_3A$, . . . and the implantation layer $6_nA$ get farther from the active region. The width s2 of the interlayer region and the width w2 of the implantation layer $6_2A$ contacting an end portion of this interlayer region away from active region (namely, an end portion toward the terminal part) form one set. The width s3 of the interlayer region and the width w3 of the implantation layer $6_3A$ contacting an end portion of this interlayer region away from the active region form one set. Further, the width sn of the interlayer region and the width wn of the implantation layer $6_nA$ contacting an end portion of this interlayer region away from the active region form one set. The lengths of these sets, determined by adding the widths of the interlayer regions and the widths of the corresponding implantation layers, are equal to each other. In this configuration, during formation of the implantation layer $6_1A$, the implantation layer $6_2A$, the implantation layer $6_3A$, . . . and the implantation layer $6_nA$, and formation of the diffusion layer $6_1B$, the diffusion layer $6_2B$, the diffusion layer $6_3B$, . . . and the diffusion layer $6_nB$, a relatively wide margin can be given for a RESURF implantation dose at which a semiconductor device with a relatively high static breakdown voltage is feasible. This makes it possible to manufacture a semiconductor device with relatively high yield insusceptible to the influence of fluctuations in manufacturing process. Additionally, the manufactured semiconductor device achieves all of a high breakdown voltage, excellence in robustness against fluctuations in manufacturing process, and excellence in robustness against operating environment of the semiconductor device.

According to the foregoing preferred embodiments, the interlayer insulating film 108C and the oxide film 9C are partially formed on the upper surface of the buffer region 7. More specifically, a part of the upper surface of the buffer region 7 is exposed without being covered by the interlayer insulating film 108C and the oxide film 9C. The buffer region 7 is connected to the electrode 8C. This configuration allows suppression of electric field concentration on a boundary between the interface part 3C and the terminal part 2B during turn-off shutdown operation in addition to suppression of electric field concentration during application of a static breakdown voltage. Thus, it becomes possible to increase a process margin by alleviating the dependence of a RESURF implantation dose on a static breakdown voltage while reduction in Ic(break) is prevented. By doing so, the stability of the static breakdown voltage of the semiconductor device is maintained.

According to the foregoing preferred embodiments, with an impurity concentration in the implantation layer $6_1A$, the implantation layer $6_2A$, the implantation layer $6_3A$, . . . and the implantation layer $6_nA$ defined as NC6 [cm$^{-3}$] and an impurity concentration in the well region 5 defined as NC5 [cm$^{-3}$], the following relationship is satisfied:

$NC6 = 0.1$ to $0.001 \times NC5$.

This configuration achieves an ideal electric field distribution of a shape like a trapezoid during application of a static breakdown voltage.

According to the foregoing preferred embodiments, with the depth of the lower surfaces of the implantation layer $6_1A$, the implantation layer $6_2A$, the implantation layer $6_3A$, . . . and the implantation layer $6_nA$ defined as D6 [µm] and the depth of the lower surface of the well region 5 defined as D5 [µm], the following relationship is satisfied:

$D5 - D6 \geq 1$.

This configuration makes it possible to realize an ideal electric field distribution of a shape like a trapezoid during application of a static breakdown voltage.

According to the foregoing preferred embodiments, with the width of the buffer region 7 defined as w7 [µm], an impurity concentration in the implantation layers $6_1A$, $6_2A$, $6_3A$, . . . and $6_nA$ defined as NC6 [cm$^{-3}$], an impurity concentration in the well region 5 defined as NC5 [cm$^{-3}$], and a thermal diffusion coefficient of impurities defined as c, the following relationship is satisfied:

$$W7 \geq 06 \sim 0.8 \times \sqrt{\left(c \times ln\left(\frac{NC5}{Nc6}\right)\right)}.$$

This configuration achieves the effect of the increased curvature at the end portion of the PN junction produced by the provision of the P-type buffer region 7.

According to the foregoing preferred embodiments, the semiconductor device includes the semiconductor layer 11 of the N-type (first conductivity type) and the collector layer 12D of the P-type (second conductivity type). The semiconductor layer 11 is formed on the lower surface of the semiconductor substrate 4. The collector layer 12D is formed on the lower surface of the semiconductor layer 11. The collector layer 12D is formed only in a region where the collector layer 12D overlaps the active region (namely, cell part 1D) in a plan view. This configuration allows suppression of a current from the interface part 3D and the terminal part 2D.

According to the foregoing preferred embodiments, in a method of manufacturing the semiconductor device, the well region 5 of the P$^+$-type (second conductivity type) is formed in the surface layer of the semiconductor substrate 4 of the N$^-$-type (first conductivity type) so as to surround the active region in a plan view in the surface layer of the semiconductor substrate 4. The buffer region 7 of the P-type (second conductivity type) is formed in the surface layer of the semiconductor substrate 4 so as to surround the well region 5 in a plan view. The interlayer insulating film 108B and the oxide film 9B are formed on the upper surface of the well region 5 and on the upper surface of the buffer region 7. The electrode 8B is formed on the upper surface of the oxide film 9B. The electric field relaxing structure 10 of the second conductivity type is formed in the surface layer of the semiconductor substrate 4 so as to surround the buffer region 7 in a plan view. The buffer region 7 contacts the well region 5. An impurity concentration in the buffer region 7 is reduced in a direction away from the active region. An end portion of the electrode 8B away from the active region (namely, an end portion toward the terminal part 2B) is located at a position closer to the active region (namely, closer to the cell part 1B) than an end portion of the buffer region 7 away from the active region (namely, an end portion toward the terminal part 2B). The electric field relaxing structure 10 includes a plurality of RESURF layers of the second conductivity type each surrounding the buffer region 7 in a plan view and formed in the surface layer of the semiconductor substrate 4: the RESURF layer $6_1$, the RESURF layer $6_2$, the RESURF layer $6_3$, . . . and the RESURF layer $6_n$. The RESURF layer $6_1$ closest to the active region contacts the buffer region 7. At least two RESURF layers in order of increasing distance from the active region, the RESURF layer $6_1$ and the RESURF layer $6_2$, contact each other.

This configuration allows suppression of electric field concentration on a boundary between the interface part 3B and the terminal part 2B during turn-off shutdown operation in addition to suppression of electric field concentration during application of a static breakdown voltage. Thus, it becomes possible to increase a process margin by alleviating the dependence of a RESURF implantation dose on a static breakdown voltage while reduction in Ic(break) is prevented. By doing so, the stability of the static breakdown voltage of the semiconductor device is maintained.

Even if at least one of the different structures illustrated in this specification, specifically, a different one of the structures illustrated in this specification and not listed as one of the foregoing structures is added appropriately to the foregoing structures, effects comparable to the foregoing effects are still achieved.

Unless otherwise specified, order of performing each process is changeable. <Modifications of Foregoing Preferred Embodiments>

In the foregoing preferred embodiments, components may be described from the viewpoint of a material quantity, material, dimension, shape, arrangement relative to each other, or condition for implementation, for example. These are in all aspects illustrative and not restrictive, and the components are not limited to these viewpoints given in this specification.

Thus, numerous modifications and equivalents not illustrated are assumed to be included within the technical scope disclosed in this specification. These modifications include a modification, addition, or omission of at least one component, and extraction of at least one component from at least one preferred embodiment and combination of the extracted component with a component in a different preferred embodiment, for example.

As long as no contradiction is to occur, a component described in a "singular form" in the foregoing preferred embodiments may include "one or more" such components.

Each component described in each of the foregoing preferred embodiments is a conceptual unit. The technical scope disclosed in this specification covers a case where one component is formed of a plurality of structures, a case where one component corresponds to a part of a certain structure, and a case where a plurality of components is provided in one structure.

Each component described in each of the foregoing preferred embodiments includes a structure having a different configuration or a different shape, as long as such a structure fulfills the same function.

The explanation given in this specification should in all aspects be referred to for all purposes relating to the technique in this specification and should never be recognized as a background art.

In the foregoing preferred embodiments, if the name of a material is given without particular designation, for example, this material includes a material such as an alloy containing a different additive, as long as no contradiction is to occur.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a semiconductor substrate of a first conductivity type;
   a well region of a second conductivity type surrounding an active region in a plan view and formed in a surface layer of the semiconductor substrate, the active region being a region in which an element structure is formed in the surface layer of the semiconductor substrate;
   a buffer region of the second conductivity type surrounding the well region in a plan view and formed in the surface layer of the semiconductor substrate;
   an insulating film formed on the upper surface of the well region and on the upper surface of the buffer region;
   an electrode formed on the upper surface of the insulating film; and
   an electric field relaxing structure of the second conductivity type surrounding the buffer region in a plan view and formed in the surface layer of the semiconductor substrate, wherein
   the buffer region contacts the well region,
   an impurity concentration in the buffer region is reduced in a direction away from the active region,
   an end portion of the electrode away from the active region is located at a position closer to the active region than an end portion of the buffer region away from the active region,
   the electric field relaxing structure includes a plurality of RESURF layers of the second conductivity type each surrounding the buffer region in a plan view and formed in the surface layer of the semiconductor substrate,
   one of the RESURF layers closest to the active region contacts the buffer region, and
   at least two of the RESURF layers in order of increasing distance from the active region contact each other.

2. The semiconductor device according to claim 1, wherein
   each of the RESURF layers includes:
   a diffusion layer of the second conductivity type surrounding the buffer region in a plan view and formed in the surface layer of the semiconductor substrate; and
   an implantation layer of the second conductivity type formed in a surface layer of the diffusion layer and higher in impurity concentration than the diffusion layer,
   the diffusion layer of the RESURF layer closest to the active region contacts the buffer region,
   the respective diffusion layers of the at least two RESURF layers in order of increasing distance from the active region contact each other,
   the widths of interlayer regions as regions between the implantation layers become smaller as the positions of the interlayer regions get farther from the active region,
   the widths of the implantation layers of the RESURF layers except the RESURF layer closest to the active region become smaller as the positions of the implantation layers get farther from the active region, and the width of each of the interlayer regions forms a set together with the width of the implantation layer contacting an end portion of this interlayer region away from the active region, and the lengths of the sets, determined by adding the widths of the interlayer regions and the widths of the corresponding implantation layers, are equal to each other.

3. The semiconductor device according to claim 1, wherein
the insulating film is partially formed on the upper surface of the buffer region, and
the buffer region is connected to the electrode.

4. The semiconductor device according to claim 2, wherein
with an impurity concentration in the implantation layer defined as NC6 [cm$^{-3}$] and an impurity concentration in the well region defined as NC5 [cm$^{-3}$], the following relationship is satisfied:

$NC6=0.1$ to $0.001 \times NC5$.

5. The semiconductor device according to claim 2, wherein
with the depth of the lower surface of the implantation layer defined as D6 [μm] and the depth of the lower surface of the well region defined as D5 [μm], the following relationship is satisfied:

$D5-D6 \geq 1$.

6. The semiconductor device according to claim 2, wherein
with the width of the buffer region defined as w7 [μm], an impurity concentration in the implantation layer defined as NC6 [cm$^{-3}$], an impurity concentration in the well region defined as NC5 [cm$^{-3}$], and a thermal diffusion coefficient of impurities defined as c, the following relationship is satisfied:

$$W7 \geq 0.6 \sim 0.8 \times \sqrt{\left(c \times \ln\left(\frac{NC5}{Nc6}\right)\right)}.$$

7. The semiconductor device according to claim 1, further comprising:
a semiconductor layer of the first conductivity type formed on the lower surface of the semiconductor substrate; and
a collector layer of the second conductivity type formed on the lower surface of the semiconductor layer, wherein
the collector layer is formed only in a region where the collector layer overlaps the active region in a plan view.

8. A method of manufacturing a semiconductor device, comprising:
forming a well region of a second conductivity type in a surface layer of a semiconductor substrate of a first conductivity type so as to surround an active region in a plan view, the active region being a region in which an element structure is formed in the surface layer of the semiconductor substrate;
forming a buffer region of the second conductivity type in the surface layer of the semiconductor substrate so as to surround the well region in a plan view;
forming an insulating film on the upper surface of the well region and on the upper surface of the buffer region;
forming an electrode on the upper surface of the insulating film; and forming an electric field relaxing structure of the second conductivity type in the surface layer of the semiconductor substrate so as to surround the buffer region in a plan view, wherein
the buffer region contacts the well region,
an impurity concentration in the buffer region is reduced in a direction away from the active region,
an end portion of the electrode away from the active region is located at a position closer to the active region than an end portion of the buffer region away from the active region,
the electric field relaxing structure includes a plurality of RESURF layers of the second conductivity type each surrounding the buffer region in a plan view and formed in the surface layer of the semiconductor substrate,
one of the RESURF layers closest to the active region contacts the buffer region, and
at least two of the RESURF layers in order of increasing distance from the active region contact each other.

9. The semiconductor device according to claim 2, wherein
the insulating film is partially formed on the upper surface of the buffer region, and
the buffer region is connected to the electrode.

10. The semiconductor device according to claim 3, wherein
with an impurity concentration in the implantation layer defined as NC6 [cm$^{-3}$] and an impurity concentration in the well region defined as NC5 [cm$^{-3}$], the following relationship is satisfied:

$NC6=0.1$ to $0.001 \times NC5$.

11. The semiconductor device according to claim 3, wherein
with the depth of the lower surface of the implantation layer defined as D6 [μm] and the depth of the lower surface of the well region defined as D5 [μm], the following relationship is satisfied:

$D5-D6 \geq 1$.

12. The semiconductor device according to claim 4, wherein
with the depth of the lower surface of the implantation layer defined as D6 [μm] and the depth of the lower surface of the well region defined as D5 [μm], the following relationship is satisfied:

$D5-D6 \geq 1$.

13. The semiconductor device according to claim 3, wherein
with the width of the buffer region defined as w7 [μm], an impurity concentration in the implantation layer defined as NC6 [cm$^{-3}$], an impurity concentration in the well region defined as NC5 [cm$^{-3}$], and a thermal diffusion coefficient of impurities defined as c, the following relationship is satisfied:

$$W7 \geq 0.6 \sim 0.8 \times \sqrt{\left(c \times \ln\left(\frac{NC5}{Nc6}\right)\right)}.$$

14. The semiconductor device according to claim 4, wherein
with the width of the buffer region defined as w7 [μm], an impurity concentration in the implantation layer defined as NC6 [cm$^{-3}$], an impurity concentration in the well region defined as NC5 [cm$^{-3}$], and a thermal diffusion coefficient of impurities defined as c, the following relationship is satisfied:

$$W7 \geq 0.6 \sim 0.8 \times \sqrt{\left(c \times ln\left(\frac{NC5}{Nc6}\right)\right)}.$$

15. The semiconductor device according to claim 5, wherein
with the width of the buffer region defined as w7 [μm], an impurity concentration in the implantation layer defined as NC6 [cm$^{-3}$], an impurity concentration in the well region defined as NC5 [cm$^{-3}$], and a thermal diffusion coefficient of impurities defined as c, the following relationship is satisfied:

$$W7 \geq 0.6 \sim 0.8 \times \sqrt{\left(c \times ln\left(\frac{NC5}{Nc6}\right)\right)}.$$

16. The semiconductor device according to claim 2, further comprising:
a semiconductor layer of the first conductivity type formed on the lower surface of the semiconductor substrate; and
a collector layer of the second conductivity type formed on the lower surface of the semiconductor layer, wherein
the collector layer is formed only in a region where the collector layer overlaps the active region in a plan view.

17. The semiconductor device according to claim 3, further comprising:
a semiconductor layer of the first conductivity type formed on the lower surface of the semiconductor substrate; and
a collector layer of the second conductivity type formed on the lower surface of the semiconductor layer, wherein
the collector layer is formed only in a region where the collector layer overlaps the active region in a plan view.

18. The semiconductor device according to claim 4, further comprising:
a semiconductor layer of the first conductivity type formed on the lower surface of the semiconductor substrate; and
a collector layer of the second conductivity type formed on the lower surface of the semiconductor layer, wherein
the collector layer is formed only in a region where the collector layer overlaps the active region in a plan view.

19. The semiconductor device according to claim 5, further comprising:
a semiconductor layer of the first conductivity type formed on the lower surface of the semiconductor substrate; and
a collector layer of the second conductivity type formed on the lower surface of the semiconductor layer, wherein
the collector layer is formed only in a region where the collector layer overlaps the active region in a plan view.

20. The semiconductor device according to claim 6, further comprising:
a semiconductor layer of the first conductivity type formed on the lower surface of the semiconductor substrate; and
a collector layer of the second conductivity type formed on the lower surface of the semiconductor layer, wherein
the collector layer is formed only in a region where the collector layer overlaps the active region in a plan view.

\* \* \* \* \*